US012769205B2

(12) United States Patent
Yamagata et al.

(10) Patent No.: US 12,769,205 B2
(45) Date of Patent: Oct. 20, 2026

(54) NEGATIVE PHOTOSENSITIVE COMPOSITION AND METHOD FOR PRODUCING HOLLOW STRUCTURE

(71) Applicant: TOKYO OHKA KOGYO CO., LTD., Kawasaki (JP)

(72) Inventors: Kenichi Yamagata, Kawasaki (JP); Ryosuke Nakamura, Kawasaki (JP); Hirofumi Imai, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 549 days.

(21) Appl. No.: 18/262,451

(22) PCT Filed: Jan. 31, 2022

(86) PCT No.: PCT/JP2022/003700
§ 371 (c)(1),
(2) Date: Jul. 21, 2023

(87) PCT Pub. No.: WO2022/168806
PCT Pub. Date: Aug. 11, 2022

(65) Prior Publication Data

US 2024/0103368 A1 Mar. 28, 2024

(30) Foreign Application Priority Data

Feb. 8, 2021 (JP) ................................ 2021-018152

(51) Int. Cl.
*G03F 7/032* (2006.01)
*G03F 7/004* (2006.01)
*G03F 7/029* (2006.01)

(52) U.S. Cl.
CPC ............ *G03F 7/032* (2013.01); *G03F 7/0043* (2013.01); *G03F 7/0295* (2013.01)

(58) Field of Classification Search
CPC ...... G03F 7/032; G03F 7/0043; G03F 7/0295; G03F 7/0047; G03F 7/004; G03F 7/027; G03F 7/038; G03F 7/0752; C08G 59/68; C08K 3/36
USPC .................................... 430/280.1, 270.1, 311
See application file for complete search history.

(56) References Cited

U.S. PATENT DOCUMENTS

2013/0076458 A1 3/2013 Katou et al.
2013/0105440 A1* 5/2013 Lu ......................... G03F 7/0047 977/773
2015/0185611 A1* 7/2015 Katou ....................... G03F 7/20 430/283.1
2018/0237549 A1* 8/2018 Takeuchi .............. B32B 27/281
2020/0019060 A1 1/2020 Katsurada et al.

FOREIGN PATENT DOCUMENTS

CN 102906641 A 1/2013
JP 2001-228610 A 8/2001
JP 2002-316965 A 10/2002
(Continued)

*Primary Examiner* — Caleen O Sullivan
(74) *Attorney, Agent, or Firm* — Knobbe, Martens, Olson & Bear, LLP

(57) ABSTRACT

A negative photosensitive composition for forming a top plate portion of a hollow structure which contains an epoxy group-containing compound, a cationic polymerization initiator, a polyfunctional (meth)acrylate compound, and a photoradical polymerization initiator.

4 Claims, 1 Drawing Sheet

(56) References Cited

FOREIGN PATENT DOCUMENTS

| | | | |
|---|---|---|---|
| JP | 2004-191840 | A | 7/2004 |
| JP | 2009-157235 | A | 7/2009 |
| JP | 2010-271401 | A | 12/2010 |
| JP | 2012-068622 | A | 4/2012 |
| JP | 2016-122153 | A | 7/2016 |
| JP | 2019-185033 | A | 10/2019 |
| KR | 10-2013-0084238 | A | 7/2013 |
| TW | 201435500 | A | 9/2014 |
| WO | WO 2009/151050 | A1 | 12/2009 |
| WO | WO 2018/173840 | A1 | 9/2018 |

* cited by examiner

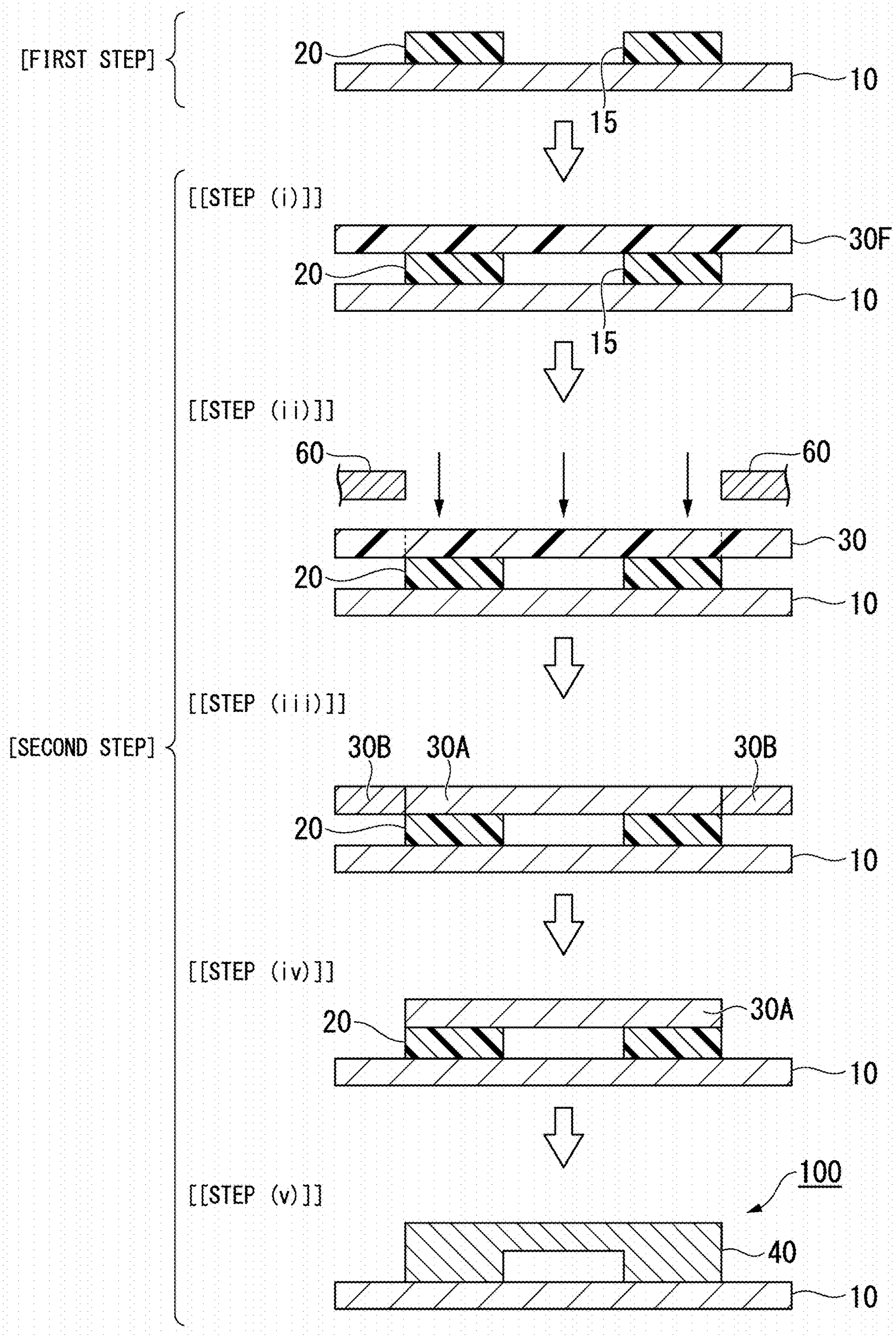
[FIRST STEP]
20
15
10
[[STEP (i)]]
30F
20
15
10
[[STEP (ii)]]
60
60
30
20
10
[[STEP (iii)]]
[SECOND STEP]
30B
30A
30B
20
10
[[STEP (iv)]]
20
30A
10
[[STEP (v)]]
100
40
10

NEGATIVE PHOTOSENSITIVE COMPOSITION AND METHOD FOR PRODUCING HOLLOW STRUCTURE

TECHNICAL FIELD

The present invention relates to a negative photosensitive composition and a method for producing a hollow structure.

Priority is claimed on Japanese Patent Application No. 2021-018152, filed Feb. 8, 2021, the content of which is incorporated herein by reference.

BACKGROUND ART

In recent years, development of microelectronic devices such as a surface acoustic wave (SAW) filter has been promoted. A package encapsulating such an electronic device has a hollow structure for ensuring propagation of the surface acoustic wave and mobility of movable members in the electronic device.

A photosensitive composition is used to form the above-described hollow structure, and a package is manufactured by molding the photosensitive composition while keeping a wiring board on which electrodes are formed hollow.

For example, Patent Document 1 discloses a method for manufacturing a hollow package, including a step of forming a cavity securing portion so as to cover Micro Electro Mechanical Systems (MEMS) formed on a substrate to produce a hollow structure, and a step of sealing the entire hollow structure with a sealing layer by transfer molding. In addition, Patent Document 1 discloses a negative photosensitive composition containing an epoxy group-containing compound and a cationic polymerization initiator.

The above-described cavity securing portion is formed as follows.

After applying the photosensitive composition around the MEMS, exposure through a photomask, post exposure bake (PEB), and development are performed to form sidewalls.

Next, a product, that a cover film had been peeled off from a dry film resist in which a base film, a photosensitive composition layer, and the cover film are laminated in this order, is laminated above the sidewalls to form a top plate portion, the exposure through a photomask, post exposure bake (PEB), and development are performed again, and an unnecessary portion is removed to form the top plate portion, thereby forming the cavity securing portion.

CITATION LIST

Patent Document

[Patent Document 1]
PCT International Publication No. WO2009/151050

SUMMARY OF INVENTION

Technical Problem

In a case of producing the hollow structure, in general, in order to increase cured film strength of the photosensitive composition layer, the cavity securing portion after the development is further subjected to a high-temperature heat treatment (curing operation) at, for example, 200° C. or higher. By the heat treatment of PEB or the high-temperature heat treatment of the curing operation in producing the hollow structure, a phenomenon called doming may occur in which air inside the hollow structure expands and the top plate portion swells.

In a case where negative photosensitive compositions in the related art, such as the negative photosensitive composition disclosed in Patent Document 1, are used for the top plate portion of the hollow structure, depending on blending balance, the doming phenomenon occurs, which makes it difficult to reduce a height of electronic components having the hollow structure.

The present invention has been made in view of the above-described circumstances, and an object of the present invention is to provide a negative photosensitive composition and a method for producing a hollow structure, in which deformation of a top plate portion due to heat treatment is suppressed.

Solution to Problem

In order to solve the above-described problem, the present invention employs the following configurations.

That is, a first aspect according to the present invention is a negative photosensitive composition for forming a top plate portion of a hollow structure, which contains an epoxy group-containing compound, a cationic polymerization initiator, a polyfunctional (meth)acrylate compound, and a photoradical polymerization initiator.

In other words, the first aspect according to the present invention is a use of a negative photosensitive composition containing an epoxy group-containing compound, a cationic polymerization initiator, a polyfunctional (meth)acrylate compound, and a photoradical polymerization initiator to form a top plate portion of a hollow structure.

A second aspect according to the present invention is a method for producing a hollow structure consisting of a recess portion and a top plate portion closing an opening surface of the recess portion, the method including forming the top plate portion using the above-described negative photosensitive composition according to the first aspect.

Advantageous Effects of Invention

According to the present invention, it is possible to provide a negative photosensitive composition and a method for producing a hollow structure, in which deformation of a top plate portion due to heat treatment is suppressed.

BRIEF DESCRIPTION OF DRAWINGS

FIG. 1 is a schematic diagram representing a method for producing a hollow structure according to an embodiment of the present invention.

DESCRIPTION OF EMBODIMENTS

In the present specification and claims, a term "aliphatic" is a relative concept used with respect to a term "aromatic" and defines a group which no aromaticity, a compound with no aromaticity, or the like.

A term "alkyl group" includes linear, branched, or cyclic monovalent saturated hydrocarbon groups unless otherwise specified. The same applies to an alkyl group in an alkoxy group.

A term "alkylene group" includes linear, branched, or cyclic divalent saturated hydrocarbon groups unless otherwise specified.

A "halogenated alkyl group" is a group in which a part of or all of hydrogen atoms in an alkyl group are substituted with halogen atoms. As the halogen atom, a fluorine atom, a chlorine atom, a bromine atom, and an iodine atom are exemplary examples.

A "fluorinated alkyl group" refers to a group in which a part of or all of hydrogen atoms in an alkyl group are substituted with fluorine atoms.

A term "constitutional unit" indicates a monomer unit constituting a polymer compound (a resin, a polymer, or a copolymer).

An expression "may have a substituent" includes a case where a hydrogen atom (—H) is substituted with a monovalent group and a case where a methylene group (—$CH_2$—) is substituted with a divalent group.

A term "exposure" is used as a general concept for irradiation with radiation.

(Negative Photosensitive Composition)

The negative photosensitive composition (hereinafter, may be simply referred to as "photosensitive composition") according to the present embodiment contains an epoxy group-containing compound (A) (hereinafter, also referred to as "component (A)"), a polyfunctional (meth)acrylate compound (B) (hereinafter, also referred to as "component (B)"), a photoradical polymerization initiator (C) (hereinafter, also referred to as "component (C)"), and a cationic polymerization initiator (I) (hereinafter, also referred to as "component (I)").

In a case where a photosensitive resin film is formed of such a photosensitive composition and selective exposure is performed on the photosensitive resin film, since a cation moiety of the component (I) is decomposed to generate an acid in an exposed portion of the photosensitive resin film, and an epoxy group in the component (A) is subjected to ring-opening polymerization due to an action of the acid so that solubility of the component (A) in a developing solution containing an organic solvent is decreased while the solubility of the component (A) in the developing solution containing an organic solvent is not changed in an unexposed portion of the photosensitive resin film. Therefore, a difference in solubility in the developing solution containing an organic solvent occurs between the exposed portion of the photosensitive resin film and the unexposed portion of the photosensitive resin film. Accordingly, in a case where the photosensitive resin film is developed with the developing solution containing an organic solvent, the unexposed portion is dissolved and removed so that a negative pattern is formed.

<Epoxy Group-Containing Compound (A)>

As the epoxy group-containing compound (component (A)), a compound having sufficient epoxy groups in one molecule to form a negative pattern by exposure is an exemplary example.

As the component (A) used in the photosensitive composition according to the present embodiment, a novolak-type epoxy resin, a bisphenol-type epoxy resin, an aliphatic epoxy resin, and an acrylic resin are exemplary examples.

<<Novolak-Type Epoxy Resin»

As the novolak-type epoxy resin (hereinafter, also referred to as "component (A1)"), an epoxy resin represented by General Formula (anv0) is a suitable exemplary example.

(anv0)

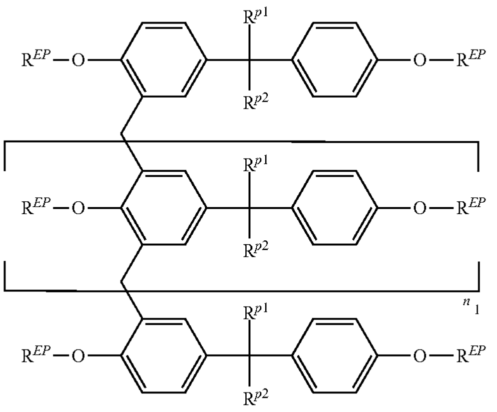

[in the formula, $R^{p1}$ and $R^{p2}$ are each independently a hydrogen atom or an alkyl group having 1 to 5 carbon atoms, a plurality of $R^{p1}$'s may be the same or different from each other, a plurality of $R^{p2}$'s may be the same or different from each other, $n_1$ is an integer of 1 to 5, $R^{EP}$ is an epoxy group-containing group, and a plurality of $R^{EP}$'s may be the same or different from each other]

In Formula (anv0), the alkyl group having 1 to 5 carbon atoms as $R^{p1}$ and $R^{p2}$ is, for example, a linear, branched, or cyclic alkyl group having 1 to 5 carbon atoms. As the linear or branched alkyl group, a methyl group, an ethyl group, a propyl group, an isopropyl group, an n-butyl group, an isobutyl group, a tert-butyl group, a pentyl group, an isopentyl group, and a neopentyl group are exemplary examples. As the cyclic alkyl group, a cyclobutyl group and a cyclopentyl group are exemplary examples.

Among these, $R^{p1}$ and $R^{p2}$ are preferably a hydrogen atom or a linear or branched alkyl group, more preferably a hydrogen atom or a linear alkyl group, and particularly preferably a hydrogen atom or a methyl group.

In Formula (anv0), a plurality of $R^{p1}$'s may be the same or different from each other. A plurality of $R^{p2}$'s may be the same or different from each other.

In Formula (anv0), $n_1$ is an integer of 1 to 5, preferably 2 or 3 and more preferably 2.

In Formula (anv0), $R^{EP}$ is an epoxy group-containing group.

The epoxy group-containing group as $R^{EP}$ is not particularly limited, and a group consisting of only an epoxy group; a group consisting of only an alicyclic epoxy group; and a group having an epoxy group or an alicyclic epoxy group and a divalent linking group are exemplary examples.

The alicyclic epoxy group is an alicyclic group having an oxacyclopropane structure as a 3-membered ring ether. Specifically, the alicyclic epoxy group is a group having an alicyclic group and an oxacyclopropane structure.

An alicyclic group which is a basic skeleton of the alicyclic epoxy group may be monocyclic or polycyclic. As the monocyclic alicyclic group, a cyclopropyl group, a cyclobutyl group, a cycloheptyl group, a cyclohexyl group, a cycloheptyl group, and a cyclooctyl group are exemplary examples. In addition, as the polycyclic alicyclic group, a norbornyl group, an isobornyl group, a tricyclononyl group, a tricyclodecyl group, and a tetracyclododecyl group are exemplary examples. In addition, hydrogen atoms in these alicyclic groups may be substituted with an alkyl group, an alkoxy group, a hydroxyl group, or the like.

In a case of the group having an epoxy group or an alicyclic epoxy group and a divalent linking group, it is preferable that the epoxy group or the alicyclic epoxy group is bonded through a divalent linking group bonded to an oxygen atom (—O—) in the formula.

Here, the divalent linking group is not particularly limited, and a divalent hydrocarbon group which may have a substituent and a divalent linking group including a hetero atom are suitable exemplary examples.

Regarding the Divalent Hydrocarbon Group which May have a Substituent:

such a divalent hydrocarbon group may be an aliphatic hydrocarbon group or an aromatic hydrocarbon group; and the aliphatic hydrocarbon group in the divalent hydrocarbon group may be saturated or unsaturated, and in general, it is preferable that the aliphatic hydrocarbon group is saturated.

More specifically, as the aliphatic hydrocarbon group, a linear or branched aliphatic hydrocarbon group and an aliphatic hydrocarbon group including a ring in the structure thereof are exemplary examples.

The number of carbon atoms in the above-described linear aliphatic hydrocarbon group is preferably 1 to 10, more preferably 1 to 6, still more preferably 1 to 4, and most preferably 1 to 3. As the linear aliphatic hydrocarbon group, a linear alkylene group is preferable. Specifically, a methylene group [$—CH_2—$], an ethylene group [$—(CH_2)_2—$], a trimethylene group [$—(CH_2)_3—$], a tetramethylene group [$—(CH_2)_4—$], and a pentamethylene group [$—(CH_2)_5—$] are exemplary examples.

The number of carbon atoms in the above-described branched aliphatic hydrocarbon group is preferably 2 to 10, more preferably 2 to 6, still more preferably 2 to 4, and most preferably 2 to 3. As the branched aliphatic hydrocarbon group, a branched alkylene group is preferable. Specifically, alkylalkylene groups, for example, alkylmethylene groups such as $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$, and $—C(CH_2CH_3)_2—$; alkyl ethylene groups such as $—CH(CH_3)CH_2—$, $—CH(CH_3)CH(CH_3)—$, $—C(CH_3)_2CH_2—$, $—CH(CH_2CH_3)CH_2—$, and $—C(CH_2CH_3)_2—CH_2—$; alkyltrimethylene groups such as $—CH(CH_3)CH_2CH_2—$, and $—CH_2CH(CH_3)CH_2—$; and alkyltetramethylene groups such as $—CH(CH_3)CH_2CH_2CH_2—$ and $—CH_2CH(CH_3)CH_2CH_2—$ are exemplary examples. As an alkyl group in the alkylalkylene group, a linear alkyl group having 1 to 5 carbon atoms is preferable.

As the aliphatic hydrocarbon group including a ring in the structure thereof, an alicyclic hydrocarbon group (a group formed by removing two hydrogen atoms from an aliphatic hydrocarbon ring), a group in which an alicyclic hydrocarbon group is bonded to the terminal of a linear or branched aliphatic hydrocarbon group, and a group in which an alicyclic hydrocarbon group is interposed in a linear or branched aliphatic hydrocarbon group are exemplary examples. As the linear or branched aliphatic hydrocarbon group, the same as those described above is an exemplary example.

The number of carbon atoms in the alicyclic hydrocarbon group is preferably 3 to 20 and more preferably 3 to 12.

The alicyclic hydrocarbon group may be a polycyclic group or a monocyclic group. As the monocyclic alicyclic hydrocarbon group, a group formed by removing two hydrogen atoms from a monocycloalkane is preferable. The number of carbon atoms in the monocycloalkane is preferably 3 to 6, and specifically, cyclopentane and cyclohexane are exemplary examples.

As the polycyclic alicyclic hydrocarbon group, a group formed by removing two hydrogen atoms from a polycycloalkane is preferable. The number of carbon atoms in the polycycloalkane is preferably 7 to 12, and specifically, adamantane, norbornane, isobornane, tricyclodecane, and tetracyclododecane are exemplary examples.

The aromatic hydrocarbon group in the divalent hydrocarbon group is a hydrocarbon group having at least one aromatic ring. The aromatic ring is not particularly limited as long as the aromatic ring has a cyclic conjugated system having (4n+2) pieces of it electrons, and may be monocyclic or polycyclic. The number of carbon atoms in the aromatic ring is preferably 5 to 30, more preferably 5 to 20, still more preferably 6 to 15, and particularly preferably 6 to 12. Specifically, as the aromatic ring, an aromatic hydrocarbon ring such as benzene, naphthalene, anthracene, and phenanthrene; and an aromatic heterocyclic ring in which a part of carbon atoms constituting the aromatic hydrocarbon ring are substituted with hetero atoms are exemplary examples. As the hetero atom in the aromatic heterocyclic ring, an oxygen atom, a sulfur atom, and a nitrogen atom are exemplary examples. Specifically, as the aromatic heterocyclic ring, a pyridine ring and a thiophene ring are exemplary examples.

Specifically, as the aromatic hydrocarbon group, a group (an arylene group or a heteroarylene group) formed by removing two hydrogen atoms from the aromatic hydrocarbon ring or the aromatic heterocyclic ring; a group formed by removing two hydrogen atoms from an aromatic compound (for example, biphenyl, fluorene, or the like) having two or more aromatic rings; and a group (for example, a group in which one hydrogen atom is further removed from an aryl group in an arylalkyl group such as a benzyl group, a phenethyl group, a 1-naphthylmethyl group, a 2-naphthylmethyl group, a 1-naphthylethyl group, and a 2-naphthylethyl group) in which one hydrogen atom of a group (an aryl group or a heteroaryl group) formed by removing one hydrogen atom from the aromatic hydrocarbon ring or the aromatic heterocyclic ring is substituted with an alkylene group are exemplary examples. The number of carbon atoms in the alkylene group which is bonded to the above-described aryl group or heteroaryl group is preferably 1 to 4, more preferably 1 or 2, and particularly preferably 1.

The divalent hydrocarbon group may have a substituent.

The linear or branched aliphatic hydrocarbon group as the divalent hydrocarbon group may or may not have a substituent. As the substituent, a fluorine atom, a fluorinated alkyl group having 1 to 5 carbon atoms which is substituted with a fluorine atom, and a carbonyl group are exemplary examples.

The alicyclic hydrocarbon group in the aliphatic hydrocarbon group including a ring in the structure thereof, as the divalent hydrocarbon group, may or may not have a substituent. As the substituent, an alkyl group, an alkoxy group, a halogen atom, a halogenated alkyl group, a hydroxyl group, and a carbonyl group are exemplary examples.

As the alkyl group as the above-described substituent, an alkyl group having 1 to carbon atoms is preferable, and a methyl group, an ethyl group, a propyl group, an n-butyl group, or a tert-butyl group is most preferable.

As the alkoxy group as the above-described substituent, an alkoxy group having 1 to 5 carbon atoms is preferable, a methoxy group, an ethoxy group, an n-propoxy group, an iso-propoxy group, an n-butoxy group, or a tert-butoxy group is preferable, and a methoxy group or an ethoxy group is most preferable.

As the halogen atom as the above-described substituent, a fluorine atom, a chlorine atom, a bromine atom, and an iodine atom are exemplary examples. Among these, a fluorine atom is preferable.

As the halogenated alkyl group as the above-described substituent, a group in which a part of or all of hydrogen atoms in the alkyl group are substituted with the halogen atoms is an exemplary example.

In the alicyclic hydrocarbon group, a part of carbon atoms constituting the ring structure thereof may be substituted with substituents having a hetero atom. As the substituent having a hetero atom, —O—, —C(=O)—O—, —S—, $—S(=O)_2—$, or $—S(=O)_2—O—$ is preferable.

In the aromatic hydrocarbon group as the divalent hydrocarbon group, a hydrogen atom in the aromatic hydrocarbon group may be substituted with a substituent. For example, the hydrogen atom bonded to the aromatic ring in the aromatic hydrocarbon group may be substituted with a substituent. As the substituent, an alkyl group, an alkoxy group, a halogen atom, a halogenated alkyl group, and a hydroxyl group are exemplary examples.

As the alkyl group as the above-described substituent, an alkyl group having 1 to carbon atoms is preferable, and a methyl group, an ethyl group, a propyl group, an n-butyl group, or a tert-butyl group is most preferable.

As the alkoxy group, the halogen atom, and the halogenated alkyl group as the above-described substituent, the same as exemplary examples of the substituent which substitutes the hydrogen atom in the alicyclic hydrocarbon group is an exemplary example.

Regarding Divalent Linking Group Including Hetero Atom:

the hetero atom in the divalent linking group including a hetero atom is an atom other than a carbon atom and a hydrogen atom, and an oxygen atom, a nitrogen atom, a sulfur atom, and a halogen atom are exemplary examples.

In the divalent linking group including a hetero atom, as the linking group, —O—, —C(=O)—O—, —C(=O)—, —O—C(=O)—O—; —C(=O)—NH—, —NH—, —NH—C(=O)—O—, —NH—C(=NH)— (H may be substituted with a substituent such as an alkyl group, an acyl group, and the like); —S—, $—S(=O)_2—$, $—S(=O)_2—O—$, and a group represented by General Formulae $—Y^{21}—O—Y^{22}—$, $—Y^{21}—O—$, $—Y^{21}—C(=O)—O—$, $—C(=O)—O—Y^{21}—$, $—[Y^{21}—C(=O)—O]_{m''}—Y^{22}—$, or $—Y^{21}—O—C(=O)—Y^{22}—$ [in the formulae, $Y^{21}$ and $Y^{22}$ each independently represent a divalent hydrocarbon group which may have a substituent, O represents an oxygen atom, and m" represents an integer of 0 to 3] are preferred exemplary examples.

In a case where the divalent linking group including a hetero atom is —C(=O)—NH—, —NH—, —NH—C(=O)—O—, or —NH—C(=NH)—, H may be substituted with a substituent such as an alkyl group, an acyl, and the like. The substituent (alkyl group, acyl group, and the like) preferably has 1 to 10 carbon atoms, more preferably has 1 to 8 carbon atoms, and particularly preferably has 1 to 5 carbon atoms.

In Formulae $—Y^{21}—O—Y^{22}—$, $—Y^{21}—O—$, $—Y^{21}—C(=O)—O—$, $—C(=)—O—Y^{21}—$, $—[Y^{21}—C(=O)—O]^{m''}—Y^{22}—$, or $—Y^{21}—O—C(=O)—Y^{22}—$, $Y^{21}$ and $Y^{22}$ each independently represent a divalent hydrocarbon group which may have a substituent. As the divalent hydrocarbon group, the same groups as those described above as the "divalent hydrocarbon group which may have a substituent" in the definition of the above-described divalent linking group are exemplary examples.

As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As $Y^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by the formula $—[Y^{21}—C(=O)—O]_{m''}—Y^{22}—$, m" is an integer of 0 to 3, preferably an integer of 0 to 2, more preferably 0 or 1, and particularly preferably 1. That is, it is particularly preferable that the group represented by Formula $—[Y^{21}—C(=O)—O]_{m''}—Y^{22}—$ is a group represented by Formula $—Y^{21}—C(=O)—O—Y^{22}—$. Among these, a group represented by Formula $—(CH_2)_{a'}—C(=O)—O—(CH_2)_{b'}—$ is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

Among these, a glycidyl group is preferable as the epoxy group-containing group in $R^{EP}$.

In addition, as the component (A1), a resin having a constitutional unit represented by General Formula (anv1) is also a suitable exemplary example.

(anv1)

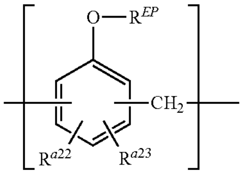

[in the formula, $R^{EP}$ is an epoxy group-containing group, and $R^{a22}$ and $R^{a23}$ are each independently a hydrogen atom, an alkyl group having 1 to 5 carbon atoms, or a halogen atom]

In Formula (anv1), the alkyl group having 1 to 5 carbon atoms as $R^{a22}$ and $R^{a23}$ has the same definition as the alkyl group having 1 to 5 carbon atoms as $R^{p1}$ and $R^{p2}$ in Formula (anv0).

It is preferable that the halogen atom as $R^{a22}$ and $R^{a23}$ is a chlorine atom or a bromine atom.

In Formula (anv1), $R^{EP}$ has the same definition as that for $R^{EP}$ in Formula (anv0), and it is preferable that $R^{EP}$ represents a glycidyl group.

Specific examples of the constitutional unit represented by Formula (anv1) are shown below.

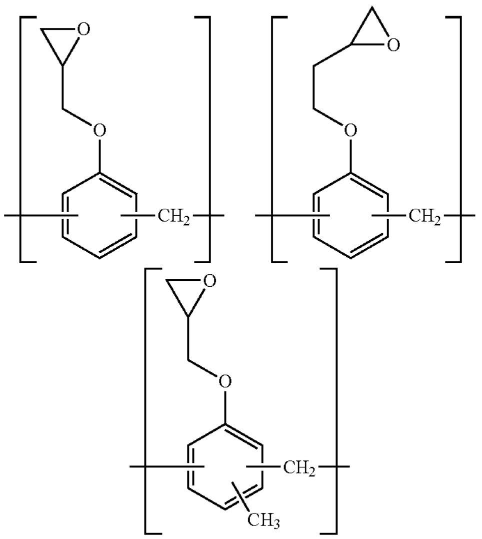

The component (A1) may be a resin consisting of only the above-described constitutional unit (anv1) or a resin having the constitutional unit (anv1) and other constitutional units.

As the other constitutional units, constitutional units represented by General Formulae (anv2) and (anv3) are exemplary examples.

(anv2)

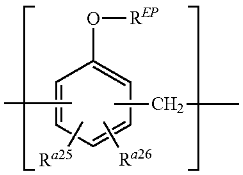

(anv3)

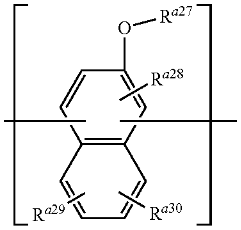

[in the formulae, $R^{a24}$ is a hydrocarbon group which may have a substituent, $R^{a25}$ and $R^{a26}$, and $R^{a28}$ to $R^{a30}$ are each independently a hydrogen atom, an alkyl group having 1 to 5 carbon atoms, or a halogen atom, and $R^{a27}$ is an epoxy group-containing group or a hydrocarbon group which may have a substituent]

In Formula (anv2), $R^{a24}$ is a hydrocarbon group which may have a substituent. As the hydrocarbon group which may have a substituent, a linear or branched alkyl group and a cyclic hydrocarbon group are exemplary examples.

The linear alkyl group preferably has 1 to 5 carbon atoms, more preferably has 1 to 4 carbon atoms, and still more preferably has 1 or 2 carbon atoms. Specifically, a methyl group, an ethyl group, an n-propyl group, an n-butyl group, and an n-pentyl group are exemplary examples. Among these, a methyl group, an ethyl group, or an n-butyl group is preferable, and a methyl group or an ethyl group is more preferable.

The branched alkyl group preferably has 3 to 10 carbon atoms and more preferably has 3 to 5 carbon atoms. Specifically, an isopropyl group, an isobutyl group, a tert-butyl group, an isopentyl group, a neopentyl group, an 1,1-diethylpropyl group, and a 2,2-dimethylbutyl group are exemplary examples. Among these, an isopropyl group is preferable.

In a case where $R^{a24}$ is a cyclic hydrocarbon group, the cyclic hydrocarbon group may be an aliphatic hydrocarbon group or an aromatic hydrocarbon group, and may be a polycyclic group or a monocyclic group.

As the aliphatic hydrocarbon group which is a monocyclic group, a group formed by removing one hydrogen atom from a monocycloalkane is preferable. The number of carbon atoms in the monocycloalkane is preferably 3 to 6, and specifically, cyclopentane and cyclohexane are exemplary examples.

As the aliphatic hydrocarbon group which is a polycyclic group, a group formed by removing one hydrogen atom from a polycycloalkane is preferable. The number of carbon atoms in the polycycloalkane is preferably 7 to 12, and specifically, adamantane, norbornane, isobornane, tricyclodecane, and tetracyclododecane are exemplary examples.

In a case where the cyclic hydrocarbon group as $R^{a24}$ is an aromatic hydrocarbon group, the aromatic hydrocarbon group is a hydrocarbon group having at least one aromatic ring.

The aromatic ring is not particularly limited as long as the aromatic ring has a cyclic conjugated system having (4n+2) pieces of π electrons, and may be monocyclic or polycyclic. The number of carbon atoms in the aromatic ring is preferably 5 to 30, more preferably 5 to 20, still more preferably 6 to 15, and particularly preferably 6 to 12. Specifically, as the aromatic ring, an aromatic hydrocarbon ring such as benzene, naphthalene, anthracene, and phenanthrene; and an aromatic heterocyclic ring in which a part of carbon atoms constituting the aromatic hydrocarbon ring are substituted with hetero atoms are exemplary examples. As the hetero atom in the aromatic heterocyclic ring, an oxygen atom, a sulfur atom, and a nitrogen atom are exemplary examples. Specifically, as the aromatic heterocyclic ring, a pyridine ring and a thiophene ring are exemplary examples.

Specifically, as the aromatic hydrocarbon group in $R^{a24}$, a group (an aryl group or a heteroaryl group) formed by removing one hydrogen atom from the aromatic hydrocarbon ring or aromatic heterocyclic ring; a group formed by removing one hydrogen atom from an aromatic compound (for example, biphenyl, fluorene, or the like) having two or more aromatic rings; and a group (for example, an arylalkyl group such as a benzyl group, a phenethyl group, a 1-naphthylmethyl group, a 2-naphthylmethyl group, a 1-naphthylethyl group, and a 2-naphthylethyl group) in which one hydrogen atom in an aromatic hydrocarbon ring or aromatic heterocyclic ring is substituted with an alkylene group are exemplary examples. The number of carbon atoms in the alkylene group which is bonded to the aromatic hydrocarbon ring or the aromatic heterocyclic ring is preferably 1 to 4, more preferably 1 or 2, and particularly preferably 1.

In Formulae (anv2) and (anv3), $R^{a25}$ and $R^{a26}$, and $R^{a28}$ to $R^{a30}$ are each independently a hydrogen atom, an alkyl group having 1 to 5 carbon atoms, or a halogen atom.

The alkyl group having 1 to 5 carbon atoms and the halogen atom have the same definition as that for $R^{a22}$ and $R^{a23}$ described above.

In Formula (anv3), $R^{a27}$ is an epoxy group-containing group or a hydrocarbon group which may have a substituent. The epoxy group-containing group of $R^{a27}$ has the same definition as that for $R^{EP}$ in Formula (anv0) described above. The hydrocarbon group of $R^{a27}$, which may have a substituent, has the same definition as that for $R^{a24}$ in Formula (anv2) described above.

Specific examples of the constitutional units represented by Formulae (anv2) and (anv3) are shown below.

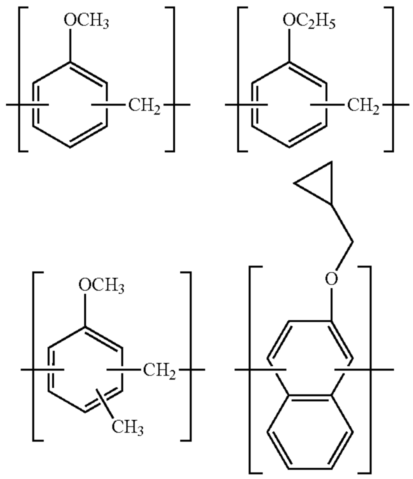

-continued

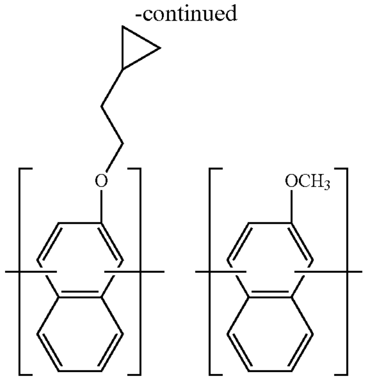

In a case where the component (A1) has other constitutional units in addition to the constitutional unit (anv1), a proportion of each constitutional unit in the component (A1) is not particularly limited, but the total amount of the constitutional units having an epoxy group is preferably 10% to 90% by mole, more preferably 20% to 80% by mole, and still more preferably 30% to 70% by mole with respect to the total amount of all constitutional units constituting the component (A1).

As a commercially available product of the component (A1), for example, as the novolak-type epoxy resin, jER-152, jER-154, jER-157S70, and jER-157S65 (all manufactured by Mitsubishi Chemical Corporation); EPICLON N-740, EPICLON N-740, EPICLON N-770, EPICLON N-775, EPICLON N-660, EPICLON N-665, EPICLON N-670, EPICLON N-673, EPICLON N-680, EPICLON N-690, EPICLON N-695, and EPICLON HP5000 (all manufactured by DIC Corporation); EOCN-1020 (manufactured by Nippon Kayaku Co., Ltd.); and YDCN-704 (manufactured by NIPPON STEEL Chemical & Material Co., Ltd.) are exemplary examples.

The component (A1) may be used alone or in combination of two or more kinds thereof.

<<Bisphenol-Type Epoxy Resin>>

The bisphenol-type epoxy resin (hereinafter, also referred to as "component (A2)") may be any resin having a constitutional unit including a bisphenol skeleton, and among these, a solid bisphenol-type epoxy resin is preferable.

The solid bisphenol-type epoxy resin refers to a resin having a constitutional unit including a bisphenol skeleton, which is solid at 25° C.

An epoxy equivalent of the component (A2) is, for example, preferably 800 g/eq. or more, more preferably 800 to 1200 g/eq., and still more preferably 900 to 1100 g/eq.

As the component (A2), an epoxy resin represented by General Formula (abp1) is a suitable exemplary example.

(abp1)

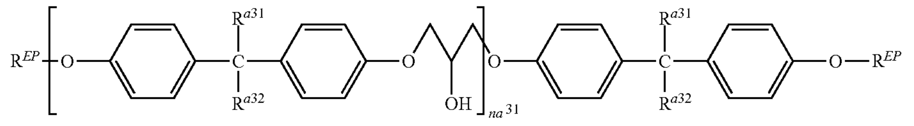

[in the formula, $R^{EP}$ is an epoxy group-containing group, a plurality of $R^{EP}$'s may be the same or different from each other, and $R^{a31}$ and $R^{a32}$ are each independently a hydrogen atom, an alkyl group having 1 to 5 carbon atoms, or a fluorinated alkyl group having 1 to 5 carbon atoms, and $na^{31}$ is an integer of 1 to 50]

In Formula (abp1), $R^{EP}$ has the same definition as that for $R^{EP}$ in Formula (anv0) described above, and it is preferable that $R^{EP}$ represents a glycidyl group.

In Formula (abp1), the alkyl group having 1 to 5 carbon atoms as $R^{a31}$ and $R^{a32}$ has the same definition as the alkyl group having 1 to 5 carbon atoms as $R^{p1}$ and $R^{p2}$ in Formula (anv0) described above. Among these, it is preferable that $R^{a31}$ and $R^{a32}$ are a hydrogen atom or a methyl group.

As the fluorinated alkyl group having 1 to 5 carbon atoms as $R^{a31}$ and $R^{a32}$, a group in which a part of or all of hydrogen atoms in the alkyl group having 1 to 5 carbon atoms as $R^{a31}$ and $R^{a32}$ described above are substituted with fluorine atoms is an exemplary example.

In Formula (abp1), $na^{31}$ is an integer of 1 to 50, preferably an integer of 4 to 15 and more preferably an integer of 5 to 8.

As a commercially available product which can be used as the component (A2), for example, JER-4005, JER-4007, and JER-4010 (all manufactured by Mitsubishi Chemical Corporation); JER-827, JER-828, JER-834, JER-1001, JER-1002, JER-1003, JER-1055, JER-1007, JER-1009, and JER-1010 (all manufactured by Mitsubishi Chemical Corporation); and EPICLON 860, EPICLON 1050, EPICLON 1051, and EPICLON 1055 (all manufactured by DIC Corporation) are exemplary examples.

The component (A2) may be used alone or in combination of two or more kinds thereof.

<<Aliphatic Epoxy Resin>>

As the aliphatic epoxy resin, for example, a compound represented by General Formula (ta1) (hereinafter, this compound is also referred to as "component (A3)") is a suitable exemplary example.

(ta1)

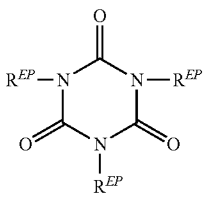

[in the formula, $R^{EP}$ is an epoxy group-containing group, and a plurality of $R^{EP}$'s may be the same or different from each other]

In Formula (ta1), $R^{EP}$ is an epoxy group-containing group, and has the same definition as $R^{EP}$ in Formula (anv0) described above.

As a commercially available product which can be used as the component (A3), for example, TEPIC series such as TEPIC, TEPIC-VL, TEPIC-PAS, TEPIC-G, TEPIC-S, TEPIC-SP, TEPIC-SS, TEPIC-HP, TEPIC-L, TEPIC-FL, and TEPIC-UC (manufactured by Nissan Chemical Industries, Ltd.); and MA-DGIC, DA-MGIC, and TOIC (manufactured by SHIKOKU KASEI HOLDINGS CORPORATION) are exemplary examples.

The component (A3) may be used alone or in combination of two or more kinds thereof.

In addition, as the aliphatic epoxy resin, a compound (hereinafter, also referred to as "component (m1)") having a partial structure represented by General Formula (m1) is also an exemplary example.

(m1)

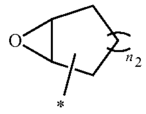

[in the formula, n2 is an integer of 1 to 4, and * represents a bonding site]

In Formula (m1), n2 is an integer of 1 to 4, preferably an integer of 1 to 3 and more preferably 2.

As the component (m1), compounds in which a plurality of the partial structures represented by General Formula (m1) described above are bonded through a divalent linking group or a single bond are exemplary examples. Among these, a compound in which a plurality of the partial structures represented by General Formula (m1) described above are bonded through a divalent linking group is preferable.

Here, the divalent linking group is not particularly limited, and a divalent hydrocarbon group which may have a substituent and a divalent linking group including a hetero atom is a suitable exemplary example.

Here, the divalent hydrocarbon group which may have a substituent and the divalent linking group including a hetero atom are the same as the divalent hydrocarbon group which may have a substituent and the divalent linking group including a hetero atom, described in $R^{EP}$ (epoxy group-containing group) in Formula (anv0) described above. Among these, the divalent linking group including a hetero atom is preferable, and a group represented by —$Y^{21}$—C(═O)—O— or a group represented by —C(═O)—O—$Y^{21}$— is more preferable. As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As a commercially available product which can be used as the aliphatic epoxy resin, for example, ADEKA RESIN EP-4080S, ADEKA RESIN EP-4085S, and ADEKA RESIN EP-4088S (all manufactured by ADEKA CORPORATION); CELLOXIDE 2021P, CELLOXIDE 2081, CELLOXIDE 2083, CELLOXIDE 2085, CELLOXIDE 8000, CELLOXIDE 8010, EHPE-3150, EPOLEAD PB 3600, and EPOLEAD PB4700 (all manufactured by Daicel Corporation); and DENACOL EX-211L, EX-212L, EX-214L, EX-216L, EX-321L, and EX-850L (all manufactured by Nagase ChemteX Corporation) are exemplary examples.

<<Acrylic Resin>>

As the acrylic resin, for example, a resin having an epoxy group-containing unit represented by General Formula (a1-1) or (a1-2) is an exemplary example.

(a1-1)

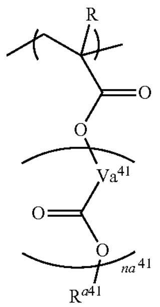

(a1-2)

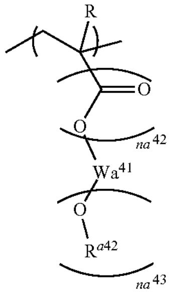

[in the formulae, R is a hydrogen atom, an alkyl group having 1 to 5 carbon atoms, or a halogenated alkyl group having 1 to 5 carbon atoms, $Va^{41}$ is a divalent hydrocarbon group which may have a substituent, $na^{41}$ is an integer of 0 to 2, $R^{a41}$ and $R^{a42}$ are each an epoxy group-containing group, $na^{42}$ is 0 or 1, $Wa^{41}$ is an $(na^{43}+1)$-valent aliphatic hydrocarbon group, and $na^{43}$ is an integer of 1 to 3]

As the alkyl group having 1 to 5 carbon atoms as R in Formula (a1-1), a linear or branched alkyl group is preferable, and specifically, a methyl group, an ethyl group, a propyl group, an isopropyl group, an n-butyl group, an isobutyl group, a tert-butyl group, a pentyl group, an isopentyl group, and a neopentyl group are exemplary examples.

The halogenated alkyl group having 1 to 5 carbon atoms as R is a group in which a part of or all of hydrogen atoms in the alkyl group having 1 to 5 carbon atoms are substituted with halogen atoms. As the halogen atom, a fluorine atom, a chlorine atom, a bromine atom, and an iodine atom are exemplary examples. Among these, a fluorine atom is particularly preferable.

As R, a hydrogen atom, an alkyl group having 1 to 5 carbon atoms, or a fluorinated alkyl group having 1 to 5 carbon atoms is preferable, and a hydrogen atom or a methyl group is more preferable from the viewpoint of industrial availability.

In Formula (a1-1), $Va^{41}$ is a divalent hydrocarbon group which may have a substituent, and the same groups as those for the divalent hydrocarbon group which may have a substituent, described in the section of $R^{EP}$ in Formula (anv0), are exemplary examples.

Among these, as the hydrocarbon group represented by $Va^{41}$, an aliphatic hydrocarbon group is preferable, a linear or branched aliphatic hydrocarbon group is more preferable, a linear aliphatic hydrocarbon group is still more preferable, and a linear alkylene group is particularly preferable.

In Formula (a1-1), $na^{41}$ is an integer of 0 to 2, preferably 0 or 1.

In Formulae (a1-1) and (a1-2), $R^{a41}$ and $R^{a42}$ are an epoxy group-containing group and have the same definition as that for $R^{EP}$ in Formula (anv0) described above.

In Formula (a1-2), the ($na^{43}$+1)-valent aliphatic hydrocarbon group in $Wa^{41}$ indicates a hydrocarbon group with no aromaticity, and may be saturated or unsaturated.

In general, it is preferable that the aliphatic hydrocarbon group is saturated. As the above-described aliphatic hydrocarbon group, a linear or branched aliphatic hydrocarbon group, an aliphatic hydrocarbon group having a ring in the structure thereof, and a group formed by combining a linear or branched aliphatic hydrocarbon group and an aliphatic hydrocarbon group having a ring in the structure thereof are exemplary examples.

In Formula (a1-2), $na^{43}$ is an integer of 1 to 3, preferably 1 or 2.

Specific examples of the constitutional unit represented by Formula (a1-1) or (a1-2) are shown below.

In the following formulae, $R^{\alpha}$ represents a hydrogen atom, a methyl group, or a trifluoromethyl group.

$R^{a51}$ represents a divalent hydrocarbon group having 1 to 8 carbon atoms. $R^{a52}$ represents a divalent hydrocarbon group having 1 to 20 carbon atoms. $R^{a53}$ represents a hydrogen atom or a methyl group. $na^{51}$ is an integer of 0 to 10.

$R^{a51}$, $R^{a52}$, and $R^{a53}$ may be the same or different from each other.

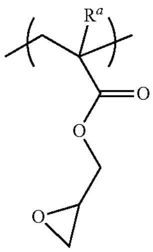
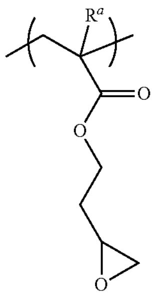
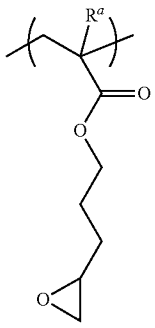

-continued

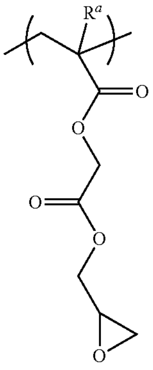
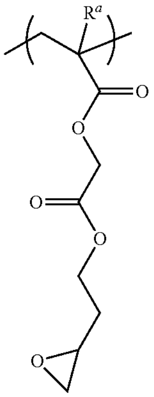
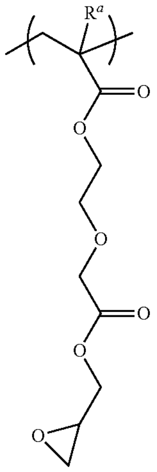

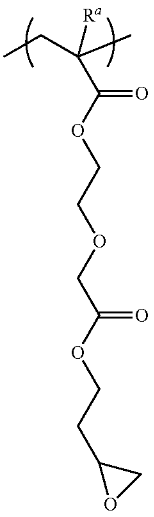
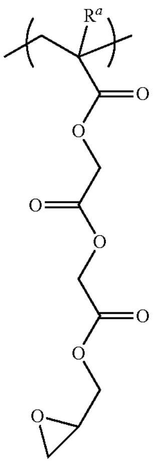
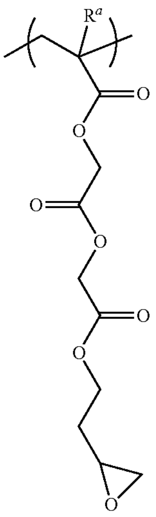

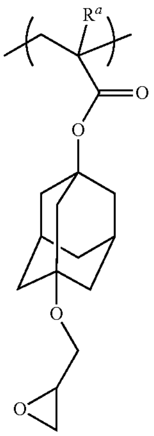
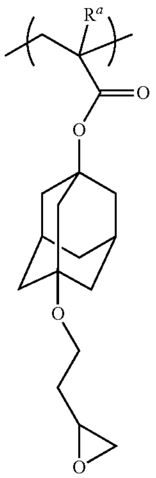

-continued
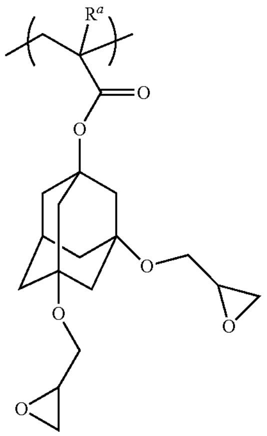
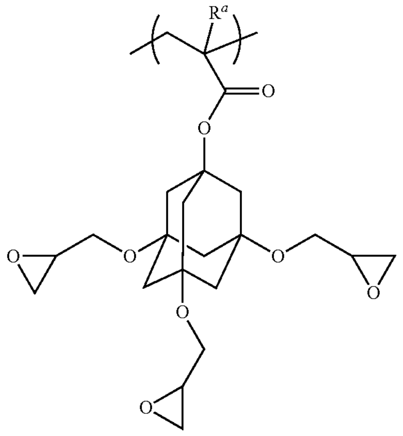
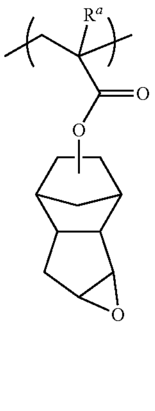
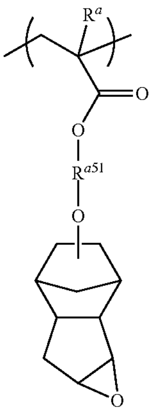
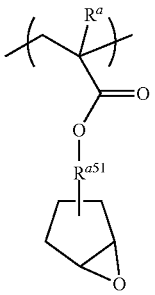
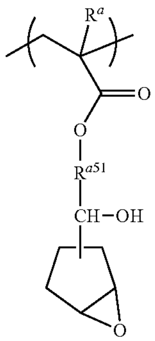
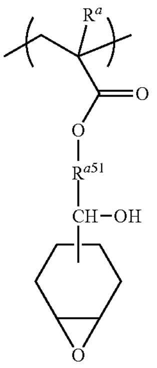
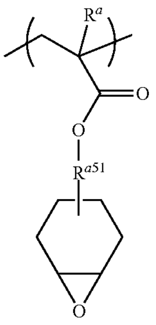
-continued
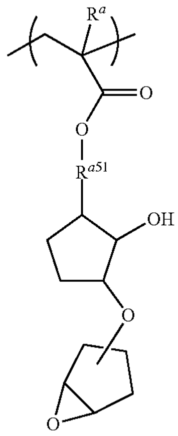
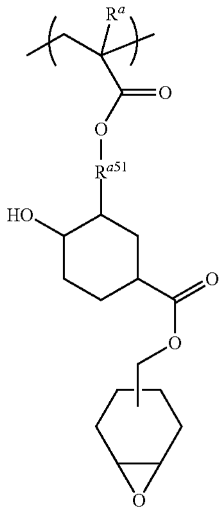
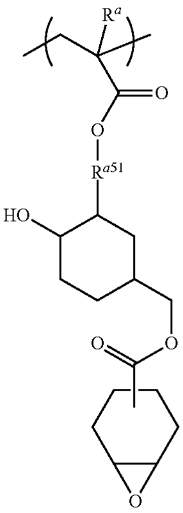
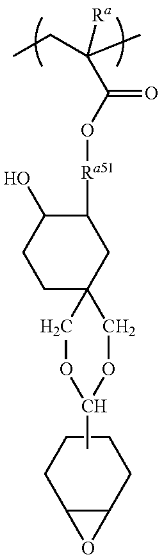
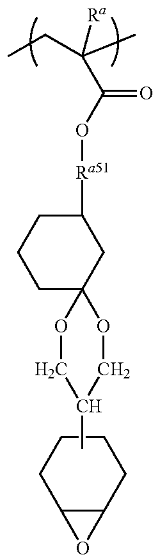
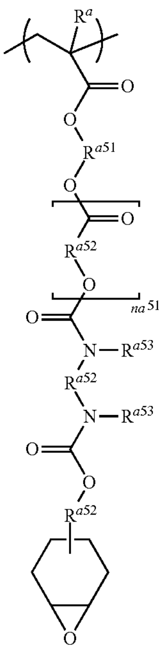
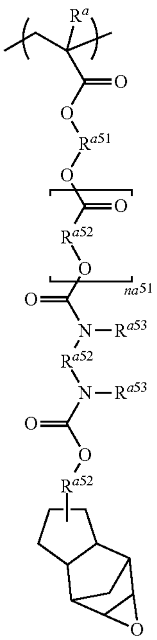
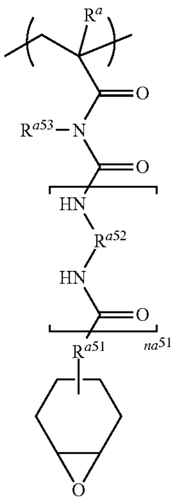

-continued

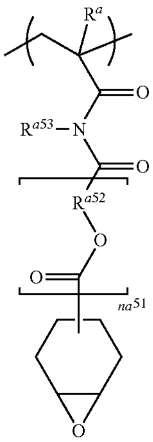
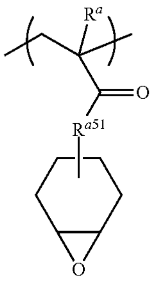
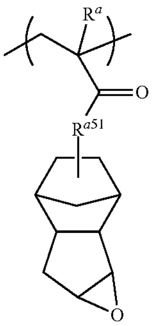

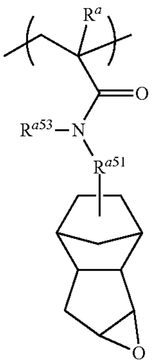
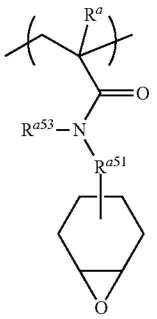
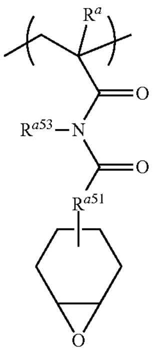

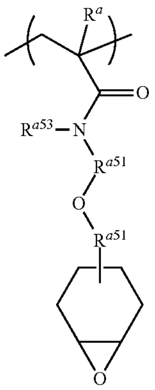
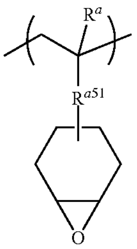
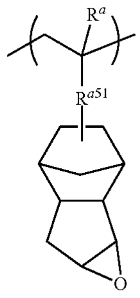

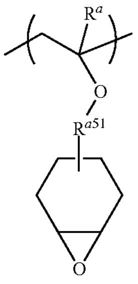
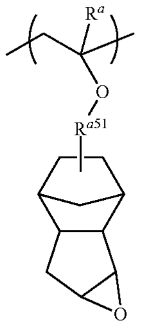
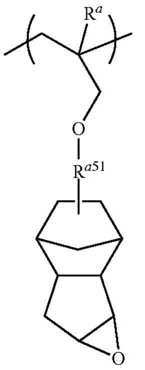

-continued

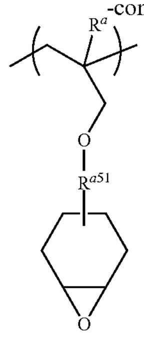
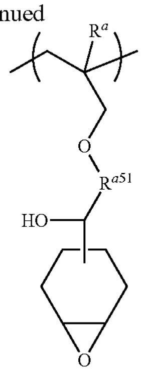

Further, the acrylic resin may have a constitutional unit derived from other polymerizable compounds for the purpose of appropriately controlling physical and chemical characteristics.

As such a polymerizable compound, known radical polymerizable compounds and anionic polymerizable compounds are exemplary examples. As such a polymerizable compound, monocarboxylic acids such as acrylic acid, methacrylic acid, and crotonic acid; dicarboxylic acids such as maleic acid, fumaric acid, and itaconic acid; methacrylic acid derivatives containing a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth)acrylic acid alkyl esters such as methyl (meth)acrylate, ethyl (meth)acrylate, and butyl (meth)acrylate; (meth)acrylic acid hydroxy alkyl esters such as 2-hydroxyethyl (meth)acrylate and 2-hydroxypropyl (meth)acrylate; (meth)acrylic acid aryl esters such as phenyl (meth) acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide are exemplary examples.

In a case where the above-described acrylic resin has other constitutional units, a content ration of the epoxy group-containing unit in the resin is preferably 5% to 40% by mole, more preferably 10% to 30% by mole, and still more preferably 15% to 25% by mole.

The acrylic resin may be used alone or in combination of two or more kinds thereof.

<<Other Epoxy Group-Containing Compounds>>

As an epoxy group-containing compound other than the above, for example, a resin having a glycidyl ether group in its structure can be used.

As the component (A), in addition to the above-described resins, a compound represented by Chemical Formula (A3-1) may be used. As a commercially available product which can be used as the compound represented by Chemical Formula (A3-1), for example, TECHMORE VG-3101L (manufactured by PRINTEC, INC.) is an exemplary example.

(A3-1)

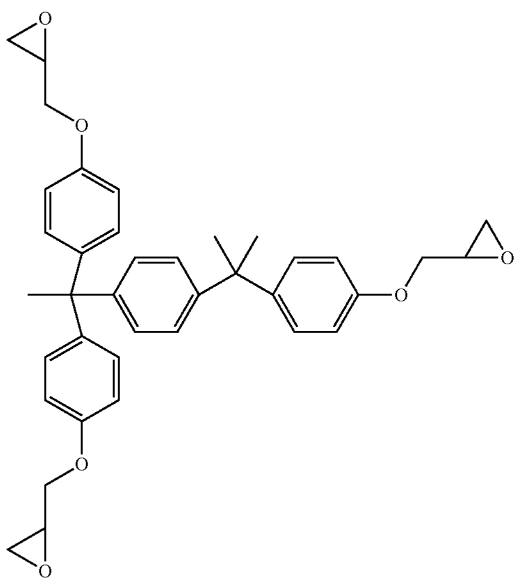

Furthermore, as the component (A), in addition to the above-described resins, a compound represented by Chemical Formula (A3-2) may be used.

(A3-2)

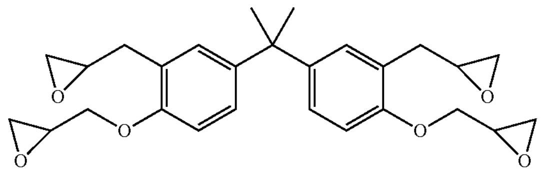

In addition, as the epoxy group-containing compound other than the above-described component (A), for example, trimethylolpropane triglycidyl ether and glycerin triglycidyl ether; pentaerythritol tetraglycidyl ether, ditrimethylolpropane tetraglycidyl ether, diglycerin tetraglycidyl ether, and erythritol tetraglycidyl ether; xylitol pentaglycidyl ether, dipentaerythritol pentaglycidyl ether, inositol pentaglycidyl ether; and dipentaerythritol hexaglycidyl ether, sorbitol hexaglycidyl ether, and inositol hexaglycidyl ether are also exemplary examples.

A content of the component (A) in the photosensitive composition according to the embodiment may be adjusted according to the film thickness and the like of the photosensitive resin film intended to be formed.

For example, the content of the component (A) in the photosensitive composition according to the present embodiment is preferably 50 parts by mass or more, more preferably 70 parts by mass or more, and still more preferably 85% by mass or more with respect to 100 parts by mass of the total content of the component (A) and the component (B).

<Polyfunctional (meth)acrylate Compound (B)>

The polyfunctional (meth)acrylate compound (component (B)) is a photopolymerizable polyfunctional monomer having a polymerizable functional group.

The "polymerizable functional group" refers to a group capable of polymerizing compounds by a radical polymerization or the like, and refers to a group which includes a multiple bond between carbon atoms, such as an ethylenic double bond.

In addition, in the present specification, the "polyfunctional" means having two or more functional groups. The polyfunctional monomer can be, for example, difunctional, trifunctional, or tetrafunctional, or can have more functional groups. For example, a polyfunctional acrylate includes diacrylate, triacrylate, and tetraacrylate. In addition, a polyfunctional methacrylate includes dimethacrylate, trimethacrylate, and tetramethacrylate.

As the polymerizable functional group, for example, a vinyl group, an allyl group, an acryloyl group, a methacryloyl group, a fluorovinyl group, a difluorovinyl group, a trifluorovinyl group, a difluorotrifluoromethylvinyl group, a trifluoroallyl group, a perfluoroallyl group, a trifluoromethylacryloyl group, a nonylfluorobutylacryloyl group, a vinyl ether group, a fluorine-containing vinyl ether group, an allyl ether group, a fluorine-containing allyl ether group, a styryl group, a vinylnaphthyl group, a fluorine-containing styryl group, a fluorine-containing vinylnaphthyl group, a norbornyl group, a fluorine-containing norbornyl group, and a silyl group are exemplary examples. Among these, a vinyl group, an allyl group, an acryloyl group, or a methacryloyl group is preferable, and an acryloyl group or a methacryloyl group is more preferable.

[Difunctional Monomer]

As the difunctional monomer, for example, alkoxylated aliphatic diacrylate, alkoxylated aliphatic dimethacrylate, alkoxylated neopentyl glycol diacrylate, alkoxylated neopentyl glycol dimethacrylate, 1,4-butanediol diacrylate, 1,4-butanediol dimethacrylate, 1,3-butylene glycol diacrylate, 1,3-butylene glycol dimethacrylate, cyclohexanedimethanol diacrylate, cyclohexanedimethanol dimethacrylate, diethylene glycol diacrylate, diethylene glycol dimethacrylate, dipropylene glycol diacrylate, dipropylene glycol dimethacrylate, 1,12-dodecanediol dimethacrylate, ethoxylated bisphenol A dimethacrylate, ethoxylated (2) bisphenol A dimethacrylate, ethoxylated (3) bisphenol A diacrylate, ethoxylated (4) bisphenol A diacrylate, ethoxylated (4) bisphenol A dimethacrylate, ethoxylated (6) bisphenol A dimethacrylate, ethoxylated (8) bisphenol A dimethacrylate, ethoxylated (10) bisphenol A diacrylate, ethoxylated (10) bisphenol A dimethacrylate, ethoxylated (30) bisphenol A diacrylate, ethoxylated (30) bisphenol A dimethacrylate, ethylene glycol dimethacrylate, 1,6-hexanediol diacrylate, 1,6-hexanediol dimethacrylate, neopentyl glycol diacrylate, neopentyl glycol dimethacrylate, polyester diacrylate, polyethylene glycol (200) diacrylate, polyethylene glycol (400) diacrylate, polyethylene glycol (400) dimethacrylate, polyethylene glycol (600) diacrylate, polyethylene glycol (600) dimethacrylate, polyethylene glycol dimethacrylate, polypropylene glycol (400) dimethacrylate, propoxylated neopentyl glycol diacrylate, propoxylated neopentyl glycol dimethacrylate, propoxylated (2) neopentyl glycol diacrylate, tetraethylene glycol diacrylate, tetraethylene glycol dimethacrylate, tricyclodecanedimethanol diacrylate, triethylene glycol diacrylate, triethylene glycol dimethacrylate, tripropylene glycol diacrylate, tripropylene glycol dimethacrylate, and a combination thereof are exemplary examples.

As a commercially available product of the difunctional monomer, for example, Light Acrylate 3EG-A, 4EG-A, 9EG-A, NP-A, DCP-A, BP-4EAL, and BP-4PA (all manufactured by Kyoeisha Chemical Co., Ltd.) are exemplary examples.

[Tri- or Higher Polyfunctional Monomer]

As a photopolymerizable compound having three or more polymerizable functional groups, a photopolymerizable siloxane compound, a photopolymerizable silsesquioxane compound, and a polyfunctional monomer having three or more polymerizable functional groups are exemplary examples.

As the photopolymerizable siloxane compound, for example, a compound having an alkoxysilyl group and a polymerizable functional group in the molecule is an exemplary example.

As a commercially available product of the photopolymerizable siloxane compound, for example, product names "KR-513", "X-40-9296", "KR-511", "X-12-1048", "X-12-1050", and the like manufactured by Shin-Etsu Chemical Co., Ltd. are exemplary examples.

As the photopolymerizable silsesquioxane compound, a compound represented by Chemical Formula: $[(RSiO_{3/2})_n]$ (in the formula, R represents an organic group and n represents a natural number), in which a main skeleton includes an Si—O bond, is an exemplary example.

R represents a monovalent organic group, and as the monovalent organic group, a monovalent hydrocarbon group which may have a substituent is an exemplary example. As the hydrocarbon group, an aliphatic hydrocarbon group and an aromatic hydrocarbon group are exemplary examples. As the aliphatic hydrocarbon group, alkyl groups having 1 to 20 carbon atoms, such as a methyl group, an ethyl group, an n-propyl group, an isopropyl group, an n-butyl group, an sec-butyl group, a tert-butyl group, a pentyl group, a hexyl group, a heptyl group, a 2-ethylhexyl group, an octyl group, a nonyl group, a decyl group, a undecyl group, and a dodecyl group, are exemplary examples, and an alkyl group having 1 to 12 carbon atoms is preferable.

As the aromatic hydrocarbon group, aromatic hydrocarbon groups having 6 to carbon atoms, such as a phenyl group, a naphthyl group, a benzyl group, a tolyl group, and a styryl group, are exemplary examples.

As the substituent which may be included in the monovalent hydrocarbon group, a (meth)acryloyl group, a hydroxy group, a sulfanyl group, a carboxy group, an isocyanato group, an amino group, and a ureido group are exemplary examples. In addition, $—CH_2—$ included in the monovalent hydrocarbon group may be replaced with —O—, —S—, a carbonyl group, or the like.

However, the photopolymerizable silsesquioxane compound has three or more polymerizable functional groups. As the polymerizable functional group here, a vinyl group, an allyl group, a methacryloyl group, and an acryloyl group are exemplary examples.

The compound represented by Chemical Formula: $[(RSiO_{3/2})_n]$ may be cage-type, ladder-type, or random-type. The cage-type silsesquioxane compound may be a complete cage or an incomplete cage such that a part of the cage is open.

As a commercially available product of the photopolymerizable silsesquioxane compound, for example, product names "MAC-SQ LP-35", "MAC-SQ TM-100", "MAC-SQ SI-20", "MAC-SQ HDM", and the like manufactured by TOAGOSEI CO., LTD. are exemplary examples.

As the polyfunctional monomer having three or more polymerizable functional groups, for example, trifunctional monomers such as ethoxylated (3) trimethylolpropane triacrylate, ethoxylated (3) trimethylolpropane trimethacrylate, ethoxylated (6) trimethylolpropane triacrylate, ethoxylated (9) trimethylolpropane triacrylate, ethoxylated (15) trimethylolpropane triacrylate, ethoxylated (20) trimethylolpropane triacrylate, pentaerythritol triacrylate, pentaerythritol trimethacrylate, propoxylated (3) glyceryl triacrylate, propoxylated (3) glyceryl triacrylate, propoxylated (5.5) glyceryl triacrylate, propoxylated (3) trimethylolpropane triacrylate, propoxylated (6) trimethylolpropane triacrylate, trimethylolpropane triacrylate, trimethylolpropane trimethacrylate, tris-(2-hydroxyethyl)-isocyanurate triacrylate, tris-(2-hydroxyethyl)-isocyanurate trimethacrylate, 8-caprolactone-modified tris-(2-acryloxyethyl)isocyanurate, EO-modified trimethylolpropane tri(meth)acrylate, PO-modified trimethylolpropane tri(meth)acrylate, and EO or PO-modified trimethylolpropane tri(meth)acrylate; tetrafunctional monomers such as ditrimethylolpropane tetraacrylate, ethoxylated (4) pentaerythritol tetraacrylate, and pentaerythritol tetra(meth)acrylate; and penta- or higher-functional monomers such as dipentaerythritol pentaacrylate and dipentaerythritol hexaacrylate are exemplary examples.

In addition to the above-described polyfunctional monomers, hexafunctional monomers and the like can be appropriately used as long as the effects of the present invention are exhibited.

As the component (B), for example, a compound represented by Chemical Formula (B-1) may be used.

(B-1)

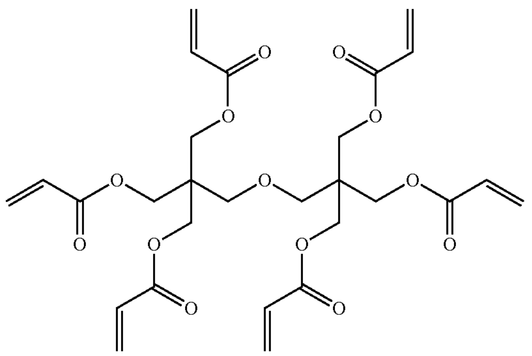

As a commercially available product of the polyfunctional monomer, for example, trade names "A-9300-1CL", "AD-TMP", "A-9550", and "A-DPH" manufactured by SHIN-NAKAMURA CHEMICAL CO, LTD., trade name "KAYARAD DPHA" manufactured by Nippon Kayaku Co., Ltd.), and trade name "Light Acrylate TMP-A" manufactured by Kyoeisha Chemical Co., Ltd.) are exemplary examples.

In the photosensitive composition according to the present embodiment, one kind of the component (B) may be used alone, or two or more kinds thereof may be used in combination. In the photosensitive composition according to the present embodiment, as the component (B), it is preferable to use a tri- or tetrafunctional monomer.

A content of the component (B) is preferably 1 to 25 parts by mass, more preferably 2 to 20 parts by mass, and still more preferably 5 to 15 parts by mass with respect to 100 parts by mass of the total content of the component (A) and the component (B).

In a case where the content of the component (B) is more than or equal to the lower limit value of the above-described preferred range, curability and fluidity of a cured resin film to be formed of the photosensitive composition are improved. On the other hand, in a case where the content of the component (B) is less than or equal to the upper limit value of the above-described preferred range, dispersibility of the photosensitive composition is improved.

<Photoradical Polymerization Initiator (C)>

The component (C) is a photoinitiator.

As the component (C), a compound which initiates or promotes the polymerization of the above-described component (B) upon exposure to light is used. As the component (C), a photoradical polymerization initiator is preferable.

As the component (C), for example, 1-hydroxycyclohexylphenyl ketone, 2-hydroxy-2-methyl-1-phenylpropan-1-one, 1-[4-(2-hydroxyethoxy)phenyl]-2-hydroxy-2-methyl-1-propan-1-one, 1-(4-isopropylphenyl)-2-hydroxy-2-methylpropan-1-one, 1-(4-dodec ylphenyl)-2-hydroxy-2-methylpropan-1-one, 2,2-dimethoxy-1,2-diphenylethan-1-one, bis(4-dimethylaminophenyl)ketone, 2-methyl-1-(4-methylthiophenyl)-2-morpholinopropan-1-one, 2-benzyl-2-dimethylamino-1-(4-morpholinophenyl)-butanone-1, ethanone-1-[9-ethyl-6-(2-methylbenzoyl)-9H-carbazol-3-yl]-1-(o-acetyloxime), bis(2,4,6-trimethylbenzoyl)-phenylphosphine oxide, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 4-dimethylamino-2-ethylhexylbenzoic acid, 4-dimethylamino-2-isoamylbenzoic acid, benzyl-β-methoxyethyl acetal, benzyl dimethyl ketal, 1-phenyl-1,2-propanedione-2-(o-ethoxycarbonyl)oxime, methyl o-benzoylbenzoate, 2,4-diethylthioxanthone, 2-chlorothioxanthone, 2,4-dimethylthioxanthone, 1-chloro-4-propoxythioxanthone, thioxanthene, 2-chlorothioxanthene, 2,4-diethylthioxanthene, 2-methylthioxanthene, 2-isopropylthioxanthene, 2-ethylanthraquinone, octamethylanthraquinone, 1,2-benzanthraquinone, 2,3-diphenylanthraquinone, azobisisobutyronitrile, benzoyl peroxide, cumene peroxide, 2-mercaptobenzimidal, 2-mercaptobenzoxazole, 2-mercaptobenzothiazole, a 2-(o-chlorophenyl)-4,5-di(m-methoxyphenyl)-imidazolyl dimer, benzophenone, 2-chlorobenzophenone, p,p'-bisdimethylaminobenzophenone, 4,4'-bisdiethylaminobenzophenone, 4,4'-dichlorobenzophenone, 3,3-dimethyl-4-methoxybenzophenone, benzoyl, benzoin, benzoin methyl ether, benzoin ethyl ether, benzoin isopropyl ether, benzoin-n-butyl ether, benzoin isobutyl ether, benzoin butyl ether, acetophenone, 2,2-diethoxyacetophenone, p-dimethylacetophenone, p-dimethylaminopropiophenone, dichloroacetophenone, trichloroacetophenone, p-tert-butylacetophenone, p-dimethylaminoacetophenone, p-tert-butyltrichloroacetophenone, p-tert-butyldichloroacetophenone, α,α-dichloro-4-phenoxyacetophenone, 2,2-dimethoxy-2-phenylacetophenone, thioxanthone, 2-methylthioxanthone, 2-isopropylthioxanthone, dibenzosuberone, pentyl-4-dimethylaminobenzoate, 9-phenylacridine, 1,7-bis-(9-acridinyl)heptane, 1,5-bis-(9-acridinyl)pentane, 1,3-bis-(9-acridinyl)propane, p-methoxytriazine, 2,4,6-tris(trichloromethyl)-s-triazine, 2-methyl-4,6-bis(trichloromethyl)-s-triazine, 2-[2-(5-methylfuran-2-yl)ethenyl]-4,6-bis(trichloromethyl)-s-triazine, 2-[2-(furan-2-yl)ethenyl]-4,6-bis(trichloromethyl)-s-triazine, 2-[2-(4-diethylamino-2-methylphenyl)ethenyl]-4,6-bis(trichloromethyl)-s-triazine, 2-[2-(3,4-dimethoxyphenyl)ethenyl]-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy)styrylphenyl-s-triazine, and 2,4-bis-trichloromethyl-6-(2-bromo-4-methoxy)styrylphenyl-s-triazine; ketone peroxides such as methyl ethyl ketone peroxide, methyl isobutyl ketone peroxide, and cyclohexanone peroxide; diacyl peroxides such as isobutyryl peroxide and bis(3,5,5-trimethylhexanoyl) peroxide; hydroperoxides such as p-menthane hydroperoxide and 1,1,3,3-tetramethylbutyl hydroperoxide; dialkyl peroxides such as 2,5-dimethyl-2,5-bis(t-butylperoxy)hexane; peroxyketals such as 1,1-bis(t-butylperoxy)-3,3,5-trimethylcyclohexane; peroxyesters such as t-butyl peroxyneodecanoate and 1,1,3,3-tetramethylperoxyneodecanoate; peroxydicarbonates such as di-n-propyl peroxydicarbonate and diisopropyl peroxydicarbonate; azo compounds such as azobisisobutyronitrile, 2,2'-azobis(2,4-dimethylvaleronitrile), and 2,2'-azobisisobutyrate; and acylphosphine oxides such as bis(2,4,6-trimethylbenzoyl)phenylphosphine oxide and 2,4,6-trimethylbenzoyl-diphenylphosphine oxide are exemplary examples.

Among the above, initiators containing no nitrogen atom, for example, benzophenone initiators such as 1-hydroxycyclohexylphenyl ketone and 2,2-dimethoxy-2-phenylacetophenone; and acylphosphine oxide initiators such as bis(2,4,6-trimethylbenzoyl)phenylphosphine oxide and 2,4,6-trimethylbenzoyl-diphenylphosphine oxide, are preferable.

A commercially available product can be obtained and used as the component (C).

As the commercially available product of the component (C), product names "Omnirad 184", "Omnirad 651", "Omnirad 819", "Omnirad TPO", and the like manufactured by IGM Resins B. V. are exemplary examples.

In the photosensitive composition according to the present embodiment, one kind of the component (C) may be used alone, or two or more kinds thereof may be used in combination.

A content of the component (C) is preferably 0.01 to 50 parts by mass, more preferably 0.05 to 30 parts by mass, and still more preferably 0.5 to 25 parts by mass with respect to 100 parts by mass of the content of the above-described component (B). In a case where the content of the component (C) is within the above-described preferred range, photocurability of the photosensitive composition is improved.

<Cationic Polymerization Initiator (I)>

The cationic polymerization initiator (component (I)) is a compound capable of generating a cation by being irradiated with active energy rays such as ultraviolet rays, far ultraviolet rays, excimer laser light of KrF, ArF, and the like, X-rays, and electron beams, and the cation becoming a polymerization initiator.

As the component (I) used in the photosensitive composition according to the present embodiment, for example, an onium borate salt, an onium salt containing a phosphorus anion, a sulfonate, and a carboxylate are exemplary examples.

<<Onium Borate Salt>>

The onium borate salt (hereinafter, also referred to as "component (I1)") generates a relatively strong acid upon exposure to light. Therefore, by forming a pattern using the photosensitive composition containing the component (I1), sufficient sensitivity can be obtained and a favorable pattern can be formed. In addition, the use of the component (I1) has a low risk of toxicity and metal corrosion.

As the component (I1), for example, a compound represented by General Formula (I1) is a suitable exemplary example.

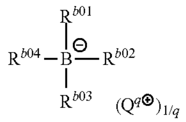

(I1)

[in the formula, $R^{b01}$ to $R^{b04}$ are each independently an aryl group which may have a substituent or a fluorine atom, q is an integer of 1 or more, and $Q^{q+}$ is a q-valent organic cation]

Anion Moiety

In Formula (I1), the aryl group in $R^{b01}$ to $R^{b04}$ preferably has 5 to 30 carbon atoms, more preferably has 5 to 20 carbon atoms, still more preferably has 6 to 15 carbon atoms, and particularly preferably has 6 to 12 carbon atoms. Specific examples thereof include a naphthyl group, a phenyl group, and an anthracenyl group. Among these, a phenyl group is preferable from the viewpoint of availability.

The aryl group in $R^{b01}$ to $R^{b04}$ may have a substituent. The substituent is not particularly limited. As the substituent, a halogen atom, a hydroxyl group, an alkyl group (preferably a linear or branched alkyl group having 1 to 5 carbon atoms), or a halogenated alkyl group is preferable, a halogen atom or a halogenated alkyl group having 1 to 5 carbon atoms is more preferable, and a fluorine atom or a fluorinated alkyl group having 1 to 5 carbon atoms is particularly preferable. It is preferable that the aryl group has a fluorine atom because the polarity of the anion moiety is increased.

Among these, $R^{b01}$ to $R^{b04}$ in Formula (I1) each represent preferably a fluorinated phenyl group and particularly preferably a perfluorophenyl group.

As the anion moiety of the compound represented by Formula (I1), specifically, tetrakis(pentafluorophenyl)borate ($[B(C_6F_5)_4]^-$); tetrakis [(trifluoromethyl)phenyl]borate ($[B(C_6H_4CF_3)_4]^-$); difluorobis(pentafluorophenyl)borate ($[(C_6F_5)_2BF_2]^-$); trifluoro(pentafluorophenyl)borate ($[(C_6F_5)BF_3]^-$); and tetrakis(difluorophenyl)borate ($[B(C_6H_3F_2)_4]^-$) are preferred exemplary examples.

Among these, tetrakis(pentafluorophenyl)borate ($[B(C_6F_5)_4]^-$) is particularly preferable.

Cation Moiety

In Formula (I1), as $Q^{q+}$, a sulfonium cation and an iodonium cation are suitable exemplary examples, and organic cations represented by General Formulae (ca-1) to (ca-5) are particularly preferable.

(ca-1)

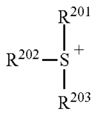

(ca-2)

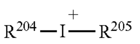

(ca-3)

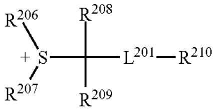

(ca-4)

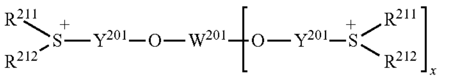

-continued (ca-5)

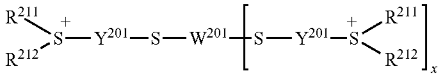

[in the formulae, $R^{201}$ to $R^{207}$, $R^{211}$, and $R^{212}$ each independently represent an aryl group which may have a substituent, a heteroaryl group, an alkyl group, or an alkenyl group, $R^{201}$ to $R^{203}$, $R^{206}$ and $R^{207}$, or $R^{211}$ and $R^{212}$ may be bonded to one another to form a ring together with the sulfur atom in the formula, $R^{208}$ and $R^{209}$ each independently represent a hydrogen atom or an alkyl group having 1 to 5 carbon atoms, $R^{210}$ represents an aryl group which may have a substituent, an alkyl group which may have a substituent, an alkenyl group which may have a substituent, or a $-SO_2$-containing cyclic group which may have a substituent, $L^{201}$ represents $-C(=O)-$ or $-C(=O)-O-$, $Y^{201}$'s each independently represent an arylene group, an alkylene group, or an alkenylene group, x is 1 or 2, and $W^{201}$ represents an (x+1)-valent linking group]

As the aryl group in $R^{201}$ to $R^{207}$, and $R^{211}$ and $R^{212}$, unsubstituted aryl groups having 6 to 20 carbon atoms are exemplary examples. Among these, a phenyl group or a naphthyl group is preferable.

As the heteroaryl group in $R^{201}$ to $R^{207}$, and $R^{211}$ and $R^{212}$, those in which a part of carbon atoms constituting the aryl group is substituted with a hetero atom are exemplary examples. As the hetero atom, an oxygen atom, a sulfur atom, and a nitrogen atom are exemplary examples. As the heteroaryl group, a group formed by removing one hydrogen atom from 9H-thioxanthene is an exemplary example, and as the substituted heteroaryl group, a group formed by removing one hydrogen atom from 9H-thioxanthene-9-one is an exemplary example.

As the alkyl group in $R^{201}$ to $R^{207}$, and $R^{211}$ and $R^{212}$, a chain-like or cyclic alkyl group having 1 to 30 carbon atoms is preferable.

As the alkenyl group in $R^{201}$ to $R^{207}$, and $R^{211}$ and $R^{212}$, an alkenyl group having 2 to 10 carbon atoms is preferable.

As the substituent which may be included in $R^{201}$ to $R^{207}$, and $R^{210}$ to $R^{212}$, for example, an alkyl group, a halogen atom, a halogenated alkyl group, a carbonyl group, a cyano group, an amino group, an oxo group (=O), an aryl group, and groups represented by Formulae (ca-r-1) to (ca-r-10) are exemplary examples.

[ca-r-1]

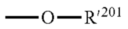

[ca-r-2]

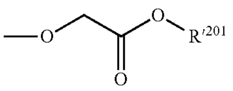

[ca-r-3]

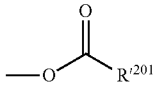

[ca-r-4]

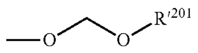

[ca-r-5]

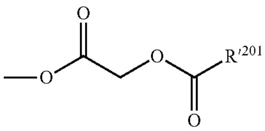

-continued

[ca-r-6]

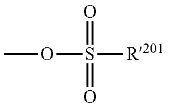

[ca-r-7]

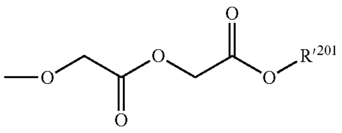

[ca-r-8]

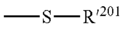

[ca-r-9]

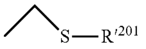

[ca-r-10]

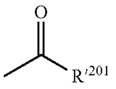

[in the formulae, R'201's are each independently a hydrogen atom, a cyclic group which may have a substituent, a chain-like alkyl group which may have a substituent, or a chain-like alkenyl group which may have a substituent]

In Formulae (ca-r-1) to (ca-r-10), R'201's are each independently a hydrogen atom, a cyclic group which may have a substituent, a chain-like alkyl group which may have a substituent, or a chain-like alkenyl group which may have a substituent.

Cyclic Group which May have Substituent:

it is preferable that the cyclic group is a cyclic hydrocarbon group, and the cyclic hydrocarbon group may be an aromatic hydrocarbon group or a cyclic aliphatic hydrocarbon group. The aliphatic hydrocarbon group indicates a hydrocarbon group with no aromaticity. In addition, the aliphatic hydrocarbon group may be saturated or unsaturated. In general, it is preferable that the aliphatic hydrocarbon group is saturated.

The aromatic hydrocarbon group in R'201 is a hydrocarbon group having an aromatic ring. The number of carbon atoms in the aromatic hydrocarbon group is preferably 3 to 30, more preferably 5 to 30, still more preferably 5 to 20, particularly preferably 6 to 15, and most preferably 6 to 10. Here, the number of carbon atoms does not include the number of carbon atoms in a substituent.

Specifically, as the aromatic ring included in the aromatic hydrocarbon group in R'201, benzene, fluorene, naphthalene, anthracene, phenanthrene, biphenyl, an aromatic heterocyclic ring in which a part of carbon atoms constituting any of these aromatic rings are substituted with hetero atom, and a ring in which a part of hydrogen atoms constituting any of these aromatic rings or aromatic heterocyclic rings are substituted with an oxo group are exemplary examples. As the hetero atom in the aromatic heterocyclic ring, an oxygen atom, a sulfur atom, and a nitrogen atom are exemplary examples.

As the aromatic hydrocarbon group in R'201, specifically, a group (an aryl group such as a phenyl group, a naphthyl group, or an anthracenyl group) formed by removing one hydrogen atom from the aromatic ring; a group (for example, an arylalkyl group such as a benzyl group, a phenethyl group, a 1-naphthylmethyl group, a 2-naphthylmethyl group, a 1-naphthylethyl group, and a 2-naphthylethyl group, and the like) in which one hydrogen atom in the aromatic ring is substituted with an alkylene group; a group formed by removing one hydrogen atom from a ring (such as anthraquinone) in which some hydrogen atoms constituting the aromatic ring is substituted with an oxo group and the like; and a group formed by removing one hydrogen atom from an aromatic heterocyclic ring (such as 9H-thioxanthene or 9H-thioxanthen-9-one) are exemplary examples. The number of carbon atoms in the above-described alkylene group (an alkyl chain in the arylalkyl group) is preferably 1 to 4, more preferably 1 or 2, and particularly preferably 1.

As the cyclic aliphatic hydrocarbon group in R'201, aliphatic hydrocarbon groups including a ring in the structure thereof are exemplary examples.

As the aliphatic hydrocarbon group including a ring in the structure thereof, an alicyclic hydrocarbon group (a group formed by removing one hydrogen atom from an aliphatic hydrocarbon ring), a group in which an alicyclic hydrocarbon group is bonded to the terminal of a linear or branched aliphatic hydrocarbon group, and a group in which an alicyclic hydrocarbon group is interposed in a linear or branched aliphatic hydrocarbon group are exemplary examples.

The number of carbon atoms in the alicyclic hydrocarbon group is preferably 3 to 20 and more preferably 3 to 12.

The alicyclic hydrocarbon group may be a polycyclic group or a monocyclic group. As the monocyclic alicyclic hydrocarbon group, a group formed by removing one or more hydrogen atoms from a monocycloalkane is preferable. The number of carbon atoms in the monocycloalkane is preferably 3 to 6, and specifically, cyclopentane and cyclohexane are exemplary examples. As the polycyclic alicyclic hydrocarbon group, a group formed by removing one or more hydrogen atoms from a polycycloalkane is preferable, and the number of carbon atoms in the polycycloalkane is preferably 7 to 30. Among these, a polycycloalkane having a bridged ring polycyclic skeleton, such as adamantane, norbornane, isobornane, tricyclodecane, and tetracyclododecane; or a polycycloalkane having a fused ring polycyclic skeleton, such as a cyclic group having a steroid skeleton, is more preferable.

Among these, as the cyclic aliphatic hydrocarbon group in R'201, a group formed by removing one or more hydrogen atoms from a monocycloalkane or a polycycloalkane is preferable, a group formed by removing one hydrogen atom from a polycycloalkane is more preferable, an adamantyl group or a norbornyl group is particularly preferable, and an adamantyl group is most preferable.

The number of carbon atoms in the linear or branched aliphatic hydrocarbon group which may be bonded to the alicyclic hydrocarbon group is preferably 1 to 10, more preferably 1 to 6, still more preferably 1 to 4, and most preferably 1 to 3.

As the linear aliphatic hydrocarbon group, a linear alkylene group is preferable. Specifically, a methylene group [$-CH_2-$], an ethylene group [$-(CH_2)_2-$], a trimethylene group [$-(CH_2)_3-$], a tetramethylene group [$-(CH_2)_4-$], and a pentamethylene group [$-(CH_2)_5$-] are exemplary examples.

As the branched aliphatic hydrocarbon group, a branched alkylene group is preferable. Specifically, alkylalkylene groups, for example, alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$, and $-C(CH_2CH_3)_2-$; alkylethylene groups such as $-CH(CH_3)CH_2-$, $-CH(CH_3)CH(CH_3)-$, $-C(CH_3)_2CH_2-$, $-CH(CH_2CH_3)CH_2-$, and $-C(CH_2CH_3)_2-CH_2-$;

alkyltrimethylene groups such as $—CH(CH_3)CH_2CH_2—$, and $—CH_2CH(CH_3)CH_2—$; and alkyltetramethylene groups such as $—CH(CH_3)CH_2CH_2CH_2—$ and $—CH_2CH(CH_3)CH_2CH_2—$ are exemplary examples. As an alkyl group in the alkylalkylene group, a linear alkyl group having 1 to 5 carbon atoms is preferable.

Chain-Like Alkyl Group which May have Substituent:

the chain-like alkyl group as $R'^{201}$ may be linear or branched.

The number of carbon atoms in the linear alkyl group is preferably 1 to 20, more preferably 1 to 15, and most preferably 1 to 10. Specifically, a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group are exemplary examples.

The number of carbon atoms in the branched alkyl group is preferably 3 to 20, more preferably 3 to 15, and most preferably 3 to 10. Specifically, a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group are exemplary examples.

Chain-Like Alkenyl Group which May have Substituent:

the chain-like alkenyl group as $R'^{201}$ may be linear or branched, and the number of carbon atoms in the chain-like alkenyl group is preferably 2 to 10, more preferably 2 to 5, still more preferably 2 to 4, and particularly preferably 3. As the linear alkenyl group, a vinyl group, a propenyl group (an allyl group), and a butynyl group are exemplary examples. As the branched alkenyl group, a 1-methylvinyl group, a 2-methylvinyl group, a 1-methylpropenyl group, and a 2-methylpropenyl group are exemplary examples.

Among the above, as the chain-like alkenyl group, a linear alkenyl group is preferable, a vinyl group or a propenyl group is more preferable, and a vinyl group is particularly preferable.

As the substituent in the cyclic group, the chain-like alkyl group, or the chain-like alkenyl group as $R'^{201}$, an alkoxy group, a halogen atom, a halogenated alkyl group, a hydroxyl group, a carbonyl group, a nitro group, an amino group, an oxo group, the cyclic group in $R'^{201}$, an alkylcarbonyl group, and a thienylcarbonyl group are exemplary examples.

Among these, it is preferable that $R'^{201}$ is a cyclic group which may have a substituent or a chain-like alkyl group which may have a substituent.

In a case where $R^{201}$ to $R^{203}$, $R^{206}$ and $R^{207}$, or $R^{211}$ and $R^{212}$ are bonded to one another to form a ring together with the sulfur atom in the formula, these groups may be bonded to one another through a hetero atom such as a sulfur atom, an oxygen atom, or a nitrogen atom, or a functional group such as a carbonyl group, —SO—, $—SO_2—$, $—SO_3—$, —COO—, —CONN—, or $—N(R_N)—$ (here, $R_N$ is an alkyl group having 1 to 5 carbon atoms). As a ring to be formed, one ring containing the sulfur atom in the formula in the ring skeleton thereof is preferably a 3- to 10-membered ring and particularly preferably a 5- to 7-membered ring, including the sulfur atom. As the ring to be formed, specifically, a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring are exemplary examples.

In Formula (ca-3), $R^{208}$ and $R^{209}$ each independently represent a hydrogen atom or an alkyl group having 1 to 5 carbon atoms and preferably a hydrogen atom or an alkyl group having 1 to 3 carbon atoms. In a case where $R^{208}$ and $R^{209}$ each represent an alkyl group, $R^{208}$ and $R^{209}$ may be bonded to each other to form a ring.

In Formula (ca-3), $R^{210}$ represents an aryl group which may have a substituent, an alkyl group which may have a substituent, an alkenyl group which may have a substituent, or a $—SO_2$-containing cyclic group which may have a substituent.

As the aryl group in $R^{210}$, unsubstituted aryl groups having 6 to 20 carbon atoms are exemplary examples, and a phenyl group or a naphthyl group is preferable.

As the alkyl group in $R^{210}$, a chain-like or cyclic alkyl group having 1 to 30 carbon atoms is preferable.

The number of carbon atoms in the alkenyl group in $R^{210}$ is preferably 2 to 10.

In Formulae (ca-4) and (ca-5), $Y^{201}$'s each independently represent an arylene group, an alkylene group, or an alkenylene group.

As the arylene group in $Y^{201}$, groups formed by removing one hydrogen atom from an aryl group of exemplary examples as the aromatic hydrocarbon group in $R'^{201}$ are exemplary examples.

As the alkylene group and alkenylene group in $Y^{201}$, groups formed by removing one hydrogen atom from a group of exemplary examples as the chain-like alkyl group or the chain-like alkenyl group in $R'^{201}$ are exemplary examples.

In Formulae (ca-4) and (ca-5), x is 1 or 2.

$W^{201}$ is an (x+1)-valent linking group, that is, a divalent or trivalent linking group.

As the divalent linking group in $W^{201}$, a divalent hydrocarbon group which may have a substituent is preferable. Further, the same divalent hydrocarbon groups which may have a substituent as exemplary examples in the section of $R^{EP}$ in Formula (A1) described above are preferable. The divalent linking group in $W^{201}$ may be linear, branched, or cyclic, and a cyclic divalent linking group is preferable. Among these, a group formed by combining two carbonyl groups at both ends of an arylene group or a group formed of only an arylene group is preferable. As the arylene group, a phenylene group and a naphthylene group are exemplary examples. Among these, a phenylene group is particularly preferable.

As the trivalent linking group in $W^{201}$, a group formed by removing one hydrogen atom from the divalent linking group in $W^{201}$ and a group in which the divalent linking group is bonded to the divalent linking group are exemplary examples. As the trivalent linking group in $W^{201}$, a group in which two carbonyl groups are bonded to an arylene group is preferable.

As the cation represented by Formula (ca-1), specifically, cations represented by Formulae (ca-1-1) to (ca-1-24) are suitable exemplary examples.

-continued
(ca-1-1)
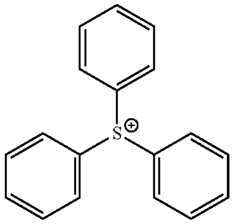
(ca-1-2)
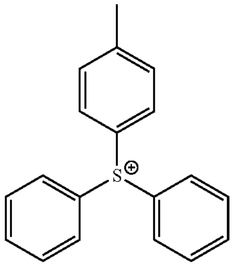
(ca-1-3)
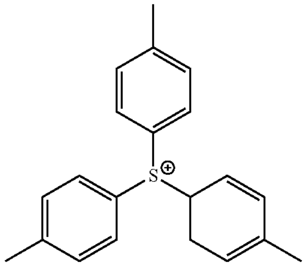
(ca-1-4)
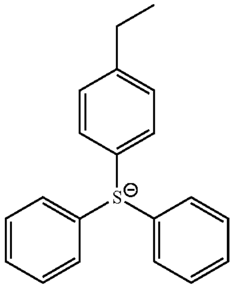
(ca-1-5)
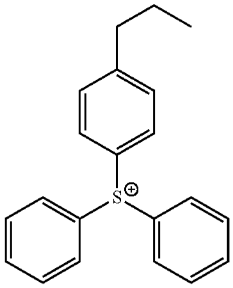
(ca-1-6)
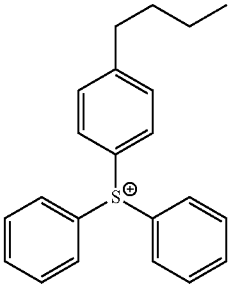
(ca-1-7)
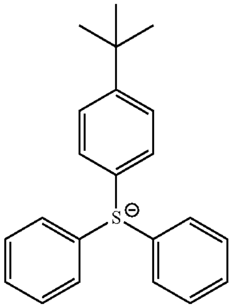
(ca-1-8)
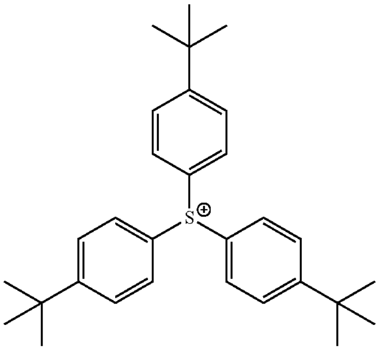
(ca-1-9)
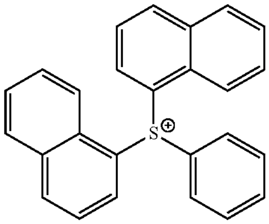
(ca-1-10)
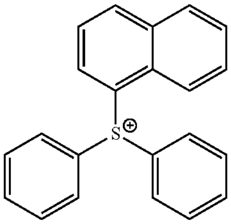

-continued
(ca-1-11)
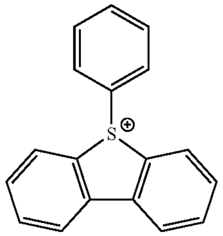
(ca-1-12)
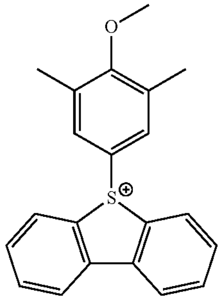
(ca-1-13)
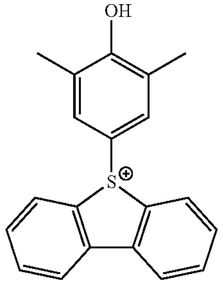
(ca-1-14)
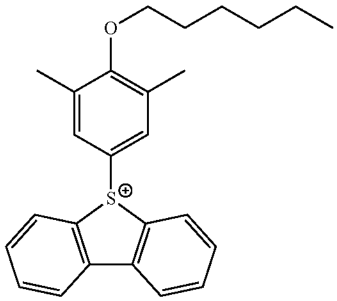
(ca-1-15)
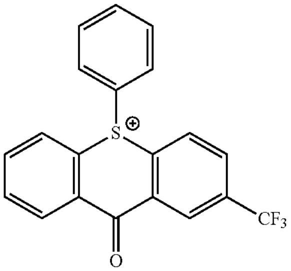
-continued
(ca-1-16)
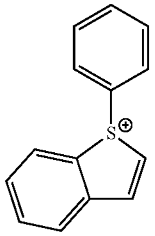
(ca-1-17)
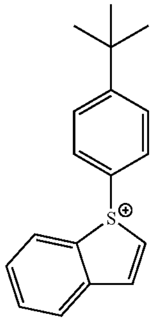
(ca-1-18)
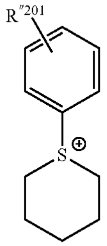
(ca-1-19)
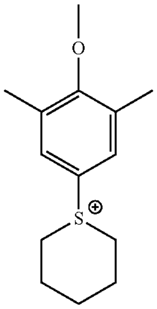
(ca-1-20)
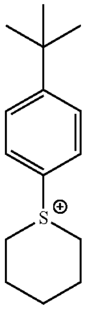

-continued (ca-1-21)

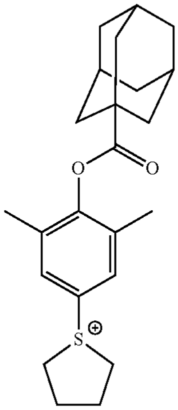

(ca-1-22)

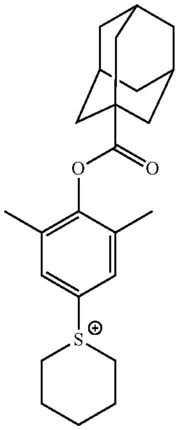

(ca-1-23)

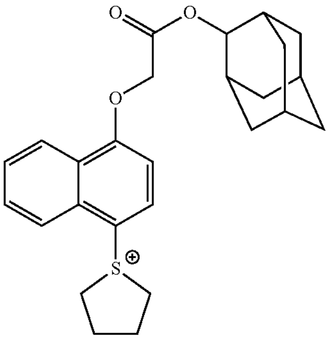

(ca-1-24)

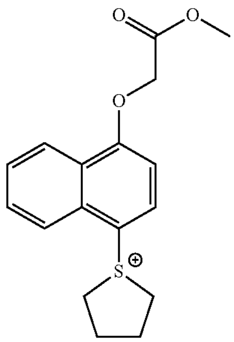

[in the formulae, $R''^{201}$ is a hydrogen atom or a substituent, and the substituent has the same definition as the exemplary examples of the substituent which may be included in $R^{201}$ to $R^{207}$ and $R^{210}$ to $R^{212}$ described above]

In addition, as the cation represented by Formula (ca-1), cations represented by General Formulae (ca-1-25) to (ca-1-35) are also preferable.

(ca-1-25)

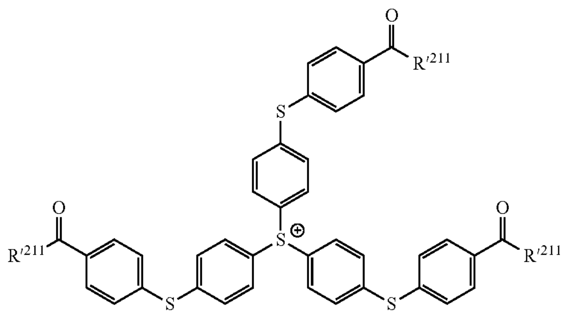

(ca-1-26)

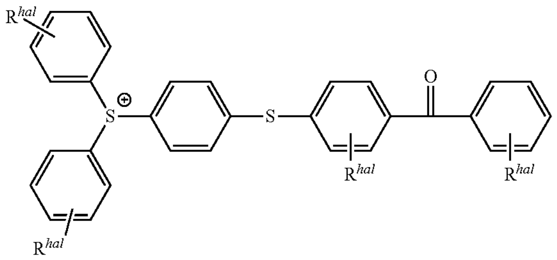

(ca-1-27)

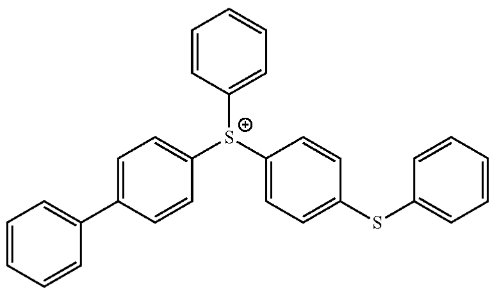

(ca-1-28)

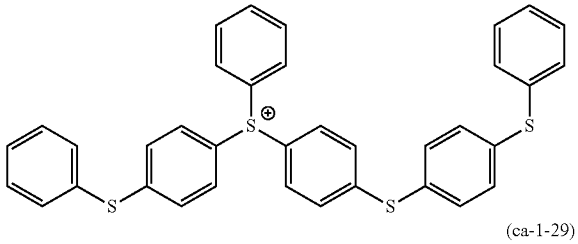

(ca-1-29)

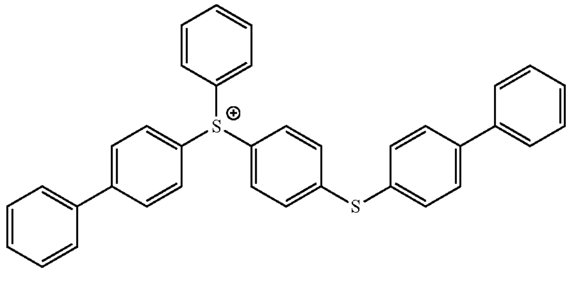

-continued
(ca-1-30)
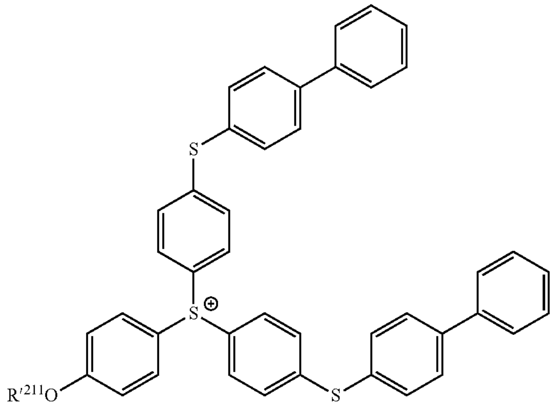
(ca-1-31)
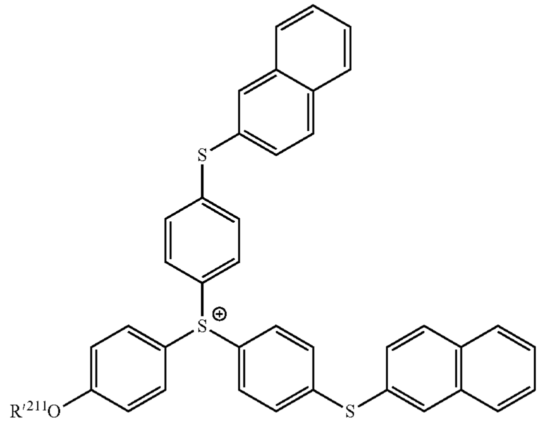
(ca-1-32)
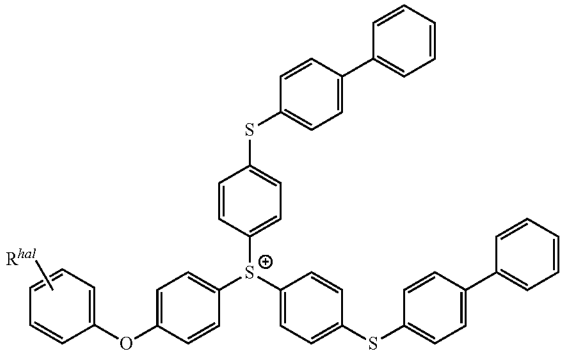
(ca-1-33)
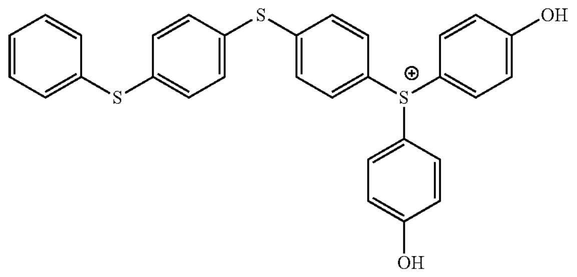
-continued
(ca-1-34)
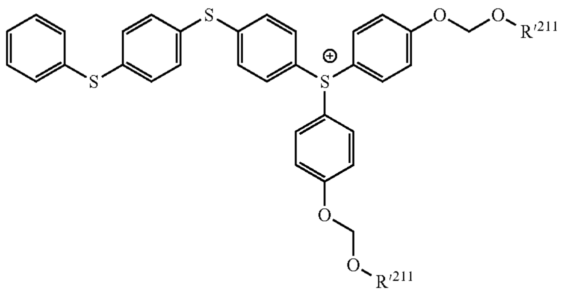
(ca-1-35)
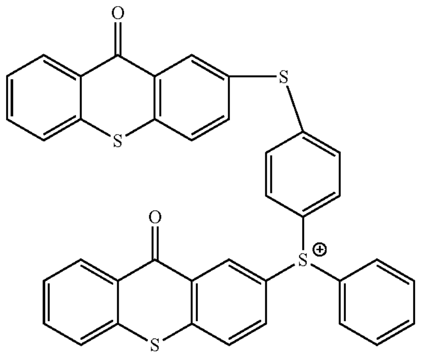
[in the formulae, $R'^{211}$ is an alkyl group, and $R^{hal}$ is a hydrogen atom or a halogen atom]
In addition, as the cation represented by Formula (ca-1), cations represented by Chemical Formulae (ca-1-36) to (ca-1-48) are also preferable.
(ca-1-36)
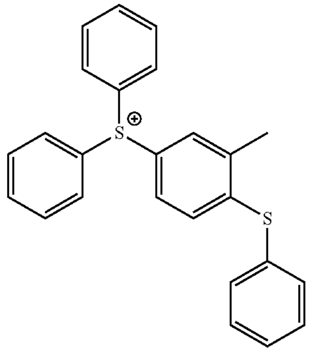

-continued
(ca-1-37)
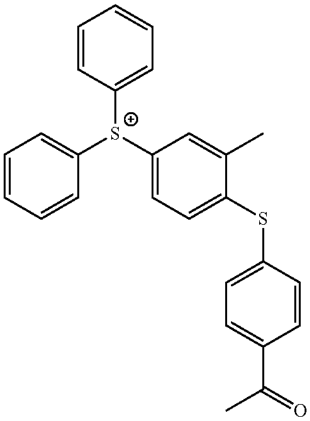
(ca-1-38)
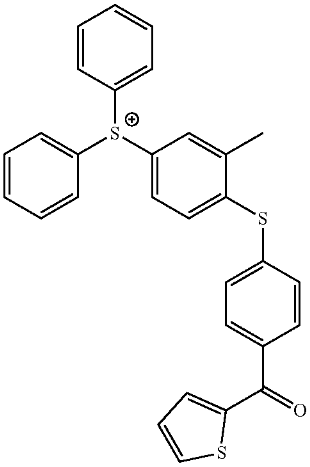
(ca-1-39)
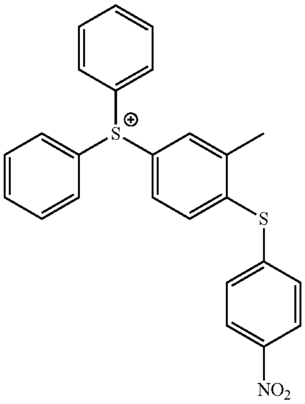
(ca-1-40)
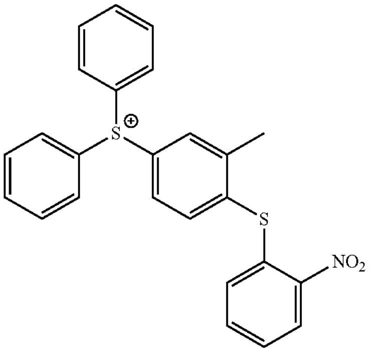
-continued
(ca-1-41)
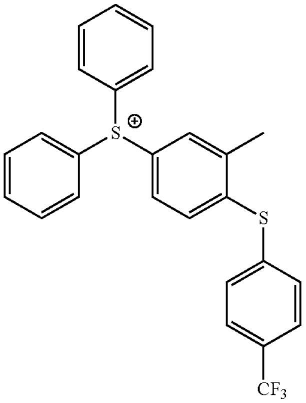
(ca-1-42)
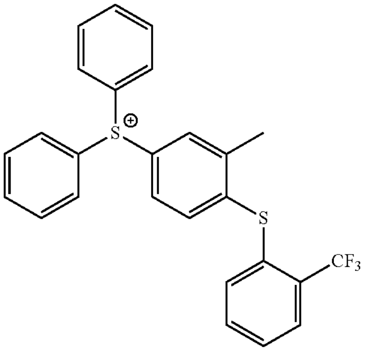
(ca-1-43)
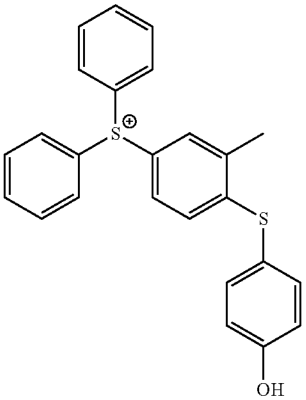
(ca-1-44)
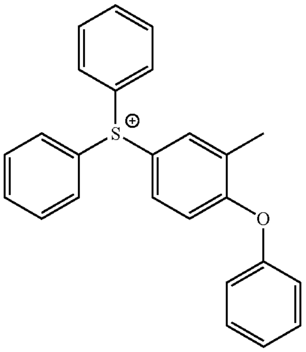

-continued (ca-1-45)

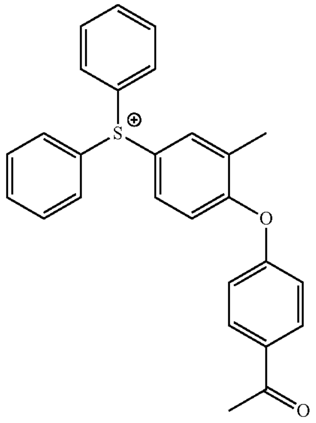

(ca-1-46)

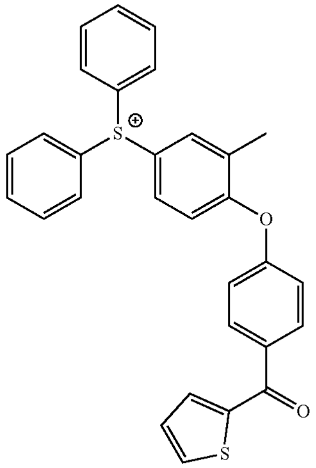

(ca-1-47)

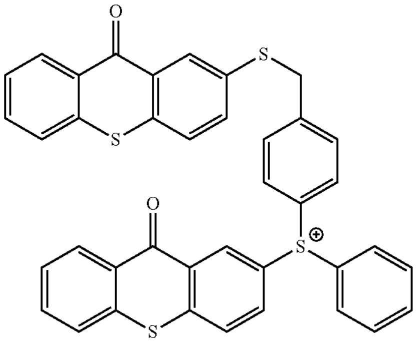

(ca-1-48)

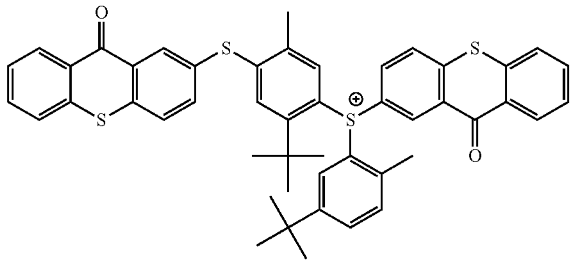

As the cation represented by Formula (ca-2), specifically, a diphenyliodonium cation and a bis(4-tert-butylphenyl) iodonium cation are suitable exemplary examples.

As the cation represented by Formula (ca-3), specifically, cations represented by Formulae (ca-3-1) to (ca-3-6) are suitable exemplary examples.

(ca-3-1)

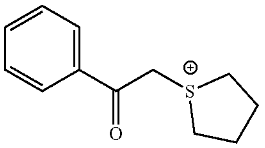

(ca-3-2)

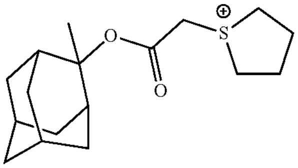

(ca-3-3)

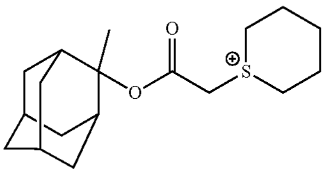

(ca-3-4)

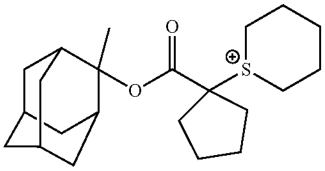

(ca-3-5)

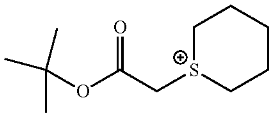

(ca-3-6)

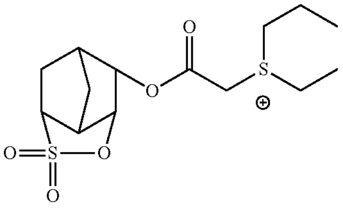

As the cation represented by Formula (ca-4), specifically, cations represented by Formulae (ca-4-1) and (ca-4-2) are suitable exemplary examples.

(ca-4-1)

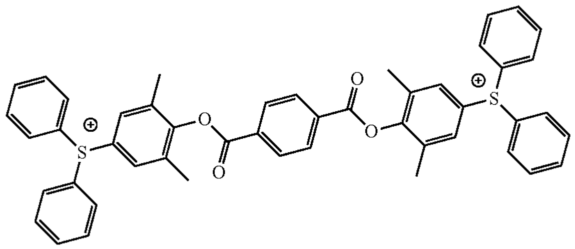

-continued
(ca-4-2)
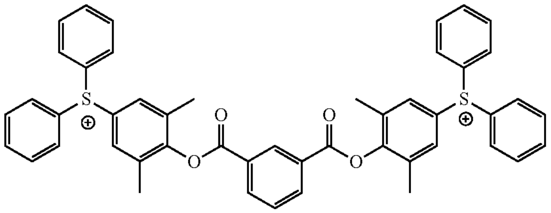
In addition, as the cation represented by Formula (ca-5), cations represented by General Formulae (ca-5-1) to (ca-5-3) are also preferable.
(ca-5-1)
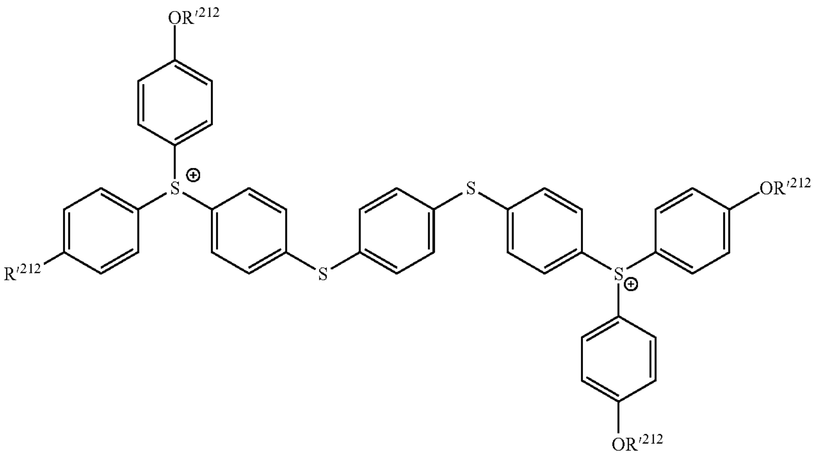
(ca-5-2)
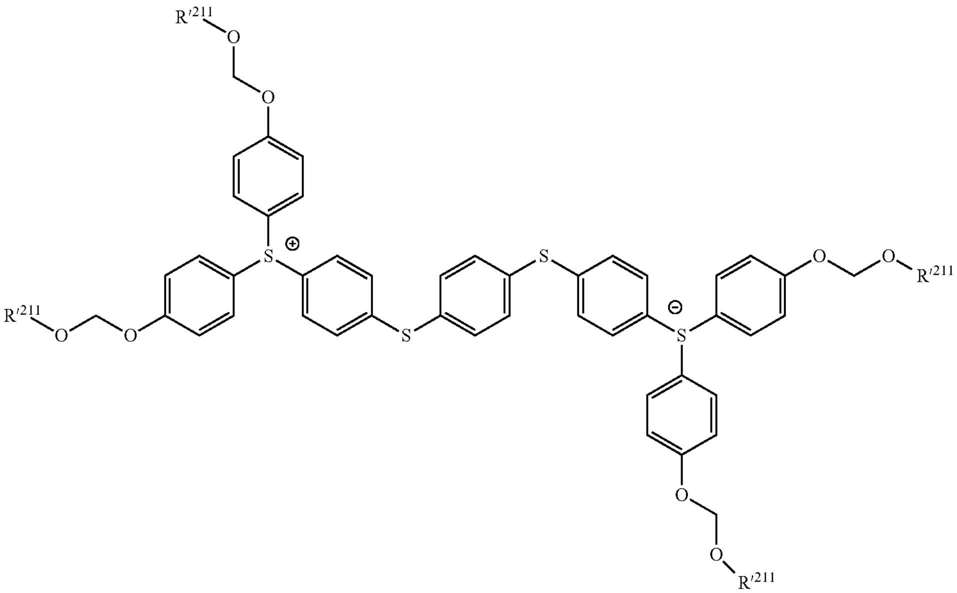

-continued (ca-5-3)

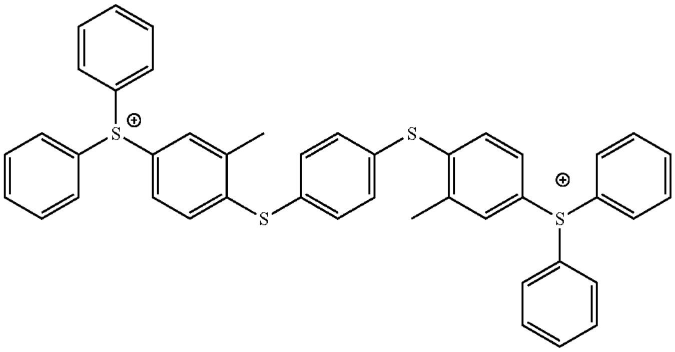

[in the formula, $R'^{212}$ represents an alkyl group or a hydrogen atom, and $R'^{211}$ represents an alkyl group]

Among the above, as the cation moiety $[(Q^{q+})_{1/q}]$, the cation represented by General Formula (ca-1) is preferable, the cations represented by Formulae (ca-1-1) to (ca-1-48) are more preferable, and the cation represented by Formula (ca-1-25), the cation represented by Formula (ca-1-29), the cation represented by Formula (ca-1-35), the cation represented by Formula (ca-1-47), or the cation represented by Formula (ca-1-48) is still more preferable.

Specific examples of the suitable component (I1) are shown below. Among the specific examples shown below, a component (I1) represented by General Formula (I1-1) or (I1-2) is more preferable.

(I1-1)

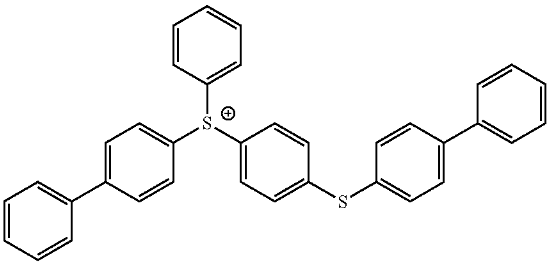

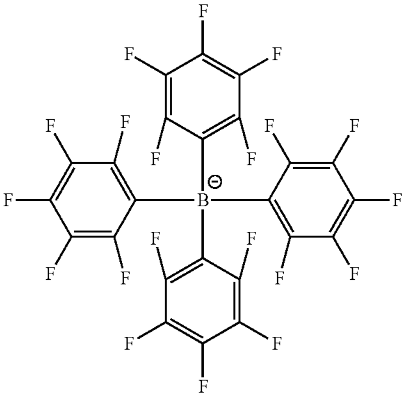

-continued (I1-2)

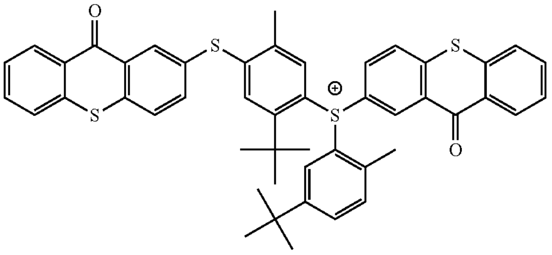

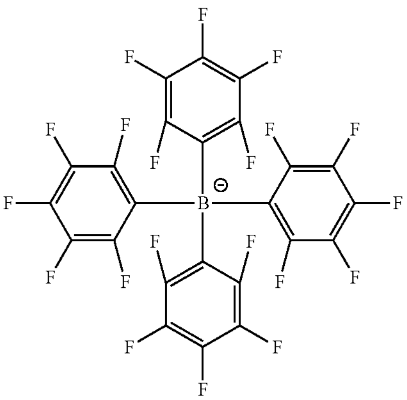

(I1-3)

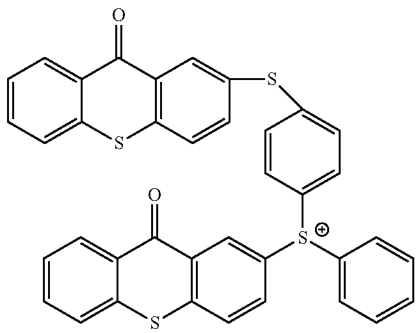

-continued

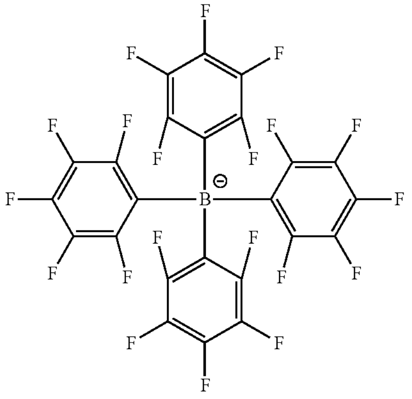

(I1-4)

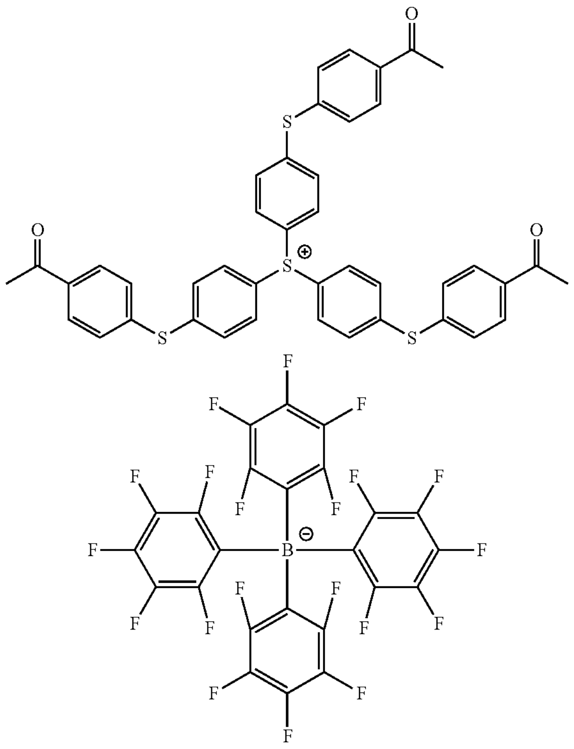

The component (I1) may be used alone or in combination of two or more kinds thereof.

In the photosensitive composition according to the present embodiment, a content of the component (I1) is preferably 0.1 to 5.0 parts by mass, more preferably 0.2 to 3.0 parts by mass, and still more preferably 0.5 to 2.0 parts by mass with respect to 100 parts by mass of the total content of the epoxy group-containing compound (component (A)) and the polyfunctional (meth)acrylate compound (component (B)).

In a case where the content of the component (I1) is more than or equal to the lower limit value of the above-described preferred range, sufficient sensitivity is obtained, and lithography characteristics of the pattern are further improved. In addition, the hardness of the cured film is further enhanced. On the other hand, in a case of being less than or equal to the upper limit value of the above-described preferred range, the sensitivity is appropriately controlled and a pattern having a favorable shape is easily obtained.

<<Onium Salt Containing Phosphorus Anion>>

As the onium salt containing a phosphorus anion, for example, a compound represented by General Formula (I2) (hereinafter, also referred to as "component (I2)") is an exemplary example.

Regarding the Compound Represented by General Formula (I2) (Component (I2)):

the component (I2) is a compound represented by General Formula (I2).

Since a relatively strong acid is generated upon exposure to light from the component (I2), in a case where a pattern is formed using the photosensitive composition containing the component (I), sufficient sensitivity can be obtained and a favorable pattern can be formed.

(I2)

$$P^{\ominus}\!\left(R^{b05}\right)_6 \left(Q^{q\oplus}\right)_{1/q}$$

[in the formula, $R^{b05}$ represents a fluorinated alkyl group which may have a substituent, or a fluorine atom, a plurality of $R^{b05}$'s may be the same or different from one another, q is an integer of 1 or more, and $Q^{q+}$ is a q-valent organic cation]

Anion Moiety

In Formula (I2), $R^{b05}$ represents a fluorinated alkyl group which may have a substituent, or a fluorine atom. A plurality of $R^{b05}$'s may be the same or different from one another.

The fluorinated alkyl group in $R^{b05}$ preferably has 1 to 10 carbon atoms, more preferably has 1 to 8 carbon atoms, and still more preferably has 1 to 5 carbon atoms. Specifically, a group in which some or all of hydrogen atoms in an alkyl group having 1 to 5 carbon atoms are substituted with a fluorine atom is an exemplary example.

Among these, $R^{b05}$ is preferably a fluorine atom or a fluorinated alkyl group having 1 to 5 carbon atoms, more preferably a fluorine atom or a perfluoroalkyl group having 1 to 5 carbon atoms, and still more preferably a fluorine atom, a trifluoromethyl group, or a pentafluoroethyl group.

It is preferable that the anion moiety of the compound represented by Formula (12) is an anion moiety represented by General Formula (b0-2a).

(b0-2a)

$$\left[(R^{bf05})_{nb^1}PF_{(6-nb^1)}\right]^{\ominus}$$

[in the formula, $R^{bf05}$ is a fluorinated alkyl group which may have a substituent, and $nb^1$ is an integer of 1 to 5]

In Formula (b0-2a), the fluorinated alkyl group which may have a substituent in $R^{bf05}$ has the same definition as the fluorinated alkyl group which may have a substituent, which is an exemplary example as $R^{b05}$.

In Formula (b0-2a), $nb^1$ is preferably an integer of 1 to 4, more preferably an integer of 2 to 4, and most preferably 3.

Cation Moiety

In Formula (I2), q is an integer of 1 or more, and $Q^{q+}$ is a q-valent organic cation.

As $Q^{q+}$, the same cations as $Q^{q+}$ in Formula (I1) described above are exemplary examples, and among these, the cation represented by General Formula (ca-1) is preferable, the cations represented by Formulae (ca-1-1) to (ca-1-48) are more preferable, and the cation represented by Formula (ca-1-25), the cation represented by Formula (ca-1-29), the cation represented by Formula (ca-1-35), or the cation represented by Formula (ca-1-47) is still more preferable.

Specific examples of the suitable component (I2) are shown below. Among the specific examples shown below, a component (I2) represented by General Formula (I2-1-1) is more preferable.

(I2-1-1)

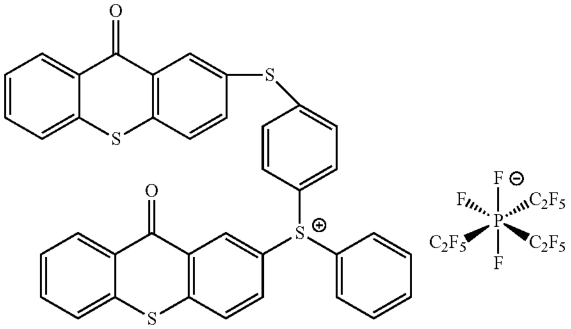

(I2-1-2)

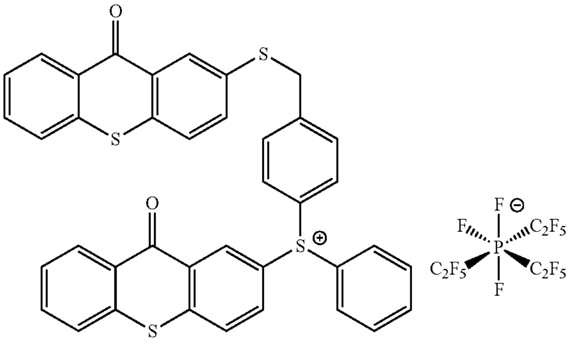

<<Sulfonate and Carboxylate>>

As the sulfonate, for example, a compound represented by General Formula (I3-1) is an exemplary example.

As the carboxylate, for example, a compound represented by General Formula (I3-2) is an exemplary example.

Hereinafter, the compounds represented by General Formula (I3-1) or (I3-2) are collectively referred to as "component (I3)".

(I3-1)

$$R^{b12}—SO_3^{\ominus} \quad (M^{m\oplus})_{1/m}$$

(I3-2)

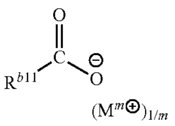

[in the formulae, $R^{b11}$ and $R^{b12}$ are a cyclic group which may have a substituent other than a halogen atom, a chain-like alkyl group which may have a substituent other than a halogen atom, or a chain-like alkenyl group which may have a substituent other than a halogen atom, in is an integer of 1 or more, and MIT's are each independently an m-valent organic cation]

{Component (I3-1)}

Anion Moiety

In Formula (I3-1), $R^{b12}$ represents a cyclic group which may have a substituent other than a halogen atom, a chain-like alkyl group which may have a substituent other than a halogen atom, or a chain-like alkenyl group which may have a substituent other than a halogen atom, and those that do not have a substituent and those having a substituent other than a halogen atom, among the cyclic group, the chain-like alkyl group, and the chain-like alkenyl group in the description for $R'^{201}$ above are exemplary examples.

It is preferable that $R^{b12}$ represents a chain-like alkyl group which may have a substituent other than a halogen atom or an aliphatic cyclic group which may have a substituent other than a halogen atom.

The number of carbon atoms in the chain-like alkyl group is preferably 1 to 10 and more preferably 3 to 10. As the aliphatic cyclic group, a group (which may have a substituent other than a halogen atom) formed by removing one or more hydrogen atoms from adamantane, norbornane, isobornane, tricyclodecane, tetracyclododecane, or the like; or a group formed by removing one or more hydrogen atoms from camphor or the like is more preferable.

The hydrocarbon group as $R^{b12}$ may have a substituent other than a halogen atom, and those same as the substituents other than a halogen atom, which may be included in the hydrocarbon group (such as an aromatic hydrocarbon group, an aliphatic cyclic group, or a chain-like alkyl group) in $R^{b11}$ in Formula (I3-2) are exemplary examples.

The expression "may have a substituent other than a halogen atom" here excludes not only a case of having a substituent formed of only a halogen atom but also a case of having a substituent having even one halogen atom (for example, a case where the substituent is a fluorinated alkyl group).

Specific preferred examples of the anion moiety of the component (I3-1) are shown below.

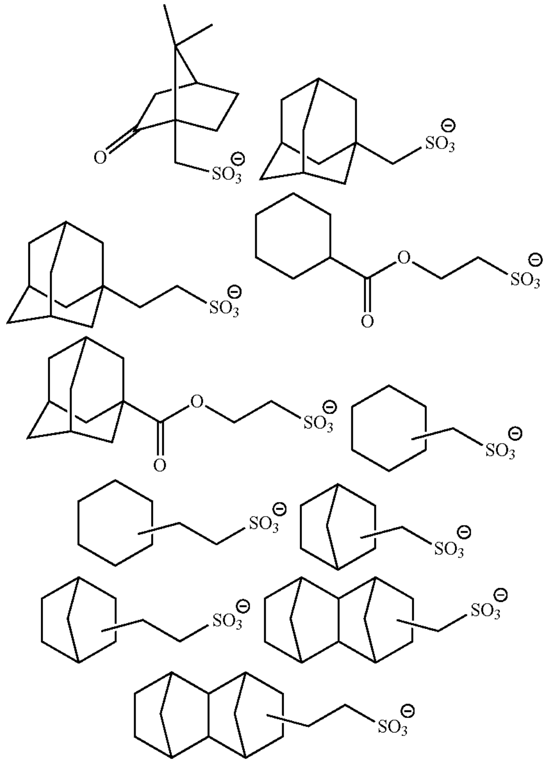

-continued

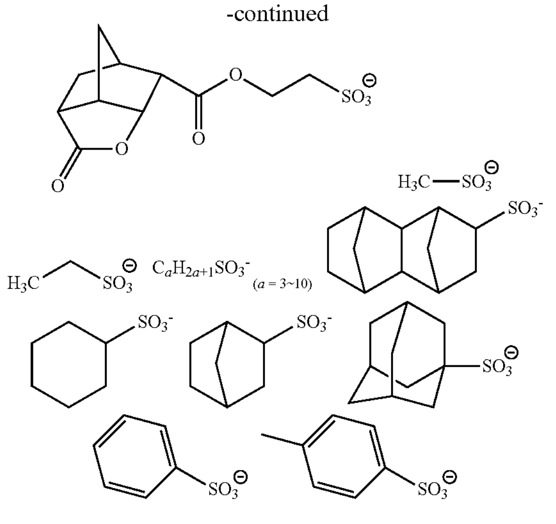

Cation Moiety

In Formula (I3-1), $M^{m+}$ is an m-valent organic cation.

As the organic cation as $M^{m+}$, the same cations represented by General Formulae (ca-1) to (ca-5) described above are suitable exemplary examples, and among these, the cation represented by the General Formula (ca-1) is more preferable. Among these, a sulfonium cation, in which at least one of $R^{201}$, $R^{202}$, and $R^{203}$ in General Formula (ca-1) is an organic group (such as an aryl group, a heteroaryl group, an alkyl group, or an alkenyl group) which may have a substituent and has 16 or more carbon atoms, is particularly preferable from the viewpoint of improving resolution and roughness characteristics.

As the substituent which may be included in the organic group, an alkyl group, a halogen atom, a halogenated alkyl group, a carbonyl group, a cyano group, an amino group, an oxo group (=O), an aryl group, and groups represented by Formulae (ca-r-1) to (ca-r-10) are exemplary examples, as described above.

The number of carbon atoms in the above-described organic group (such as an aryl group, a heteroaryl group, an alkyl group, and an alkenyl group) is preferably 16 to 25, more preferably 16 to 20, and particularly preferably 16 to 18. As the organic cation as M''', cations represented by Formulae (ca-1-25), (ca-1-26), (ca-1-28) to (ca-1-36), (ca-1-38), (ca-1-46), and (ca-1-47) are suitable exemplary examples, and among these, the cation represented by Formula (ca-1-29) is particularly preferable.

{Component (I3-2)}

Anion Moiety

In Formula (I3-2), $R^{b11}$ represents a cyclic group which may have a substituent other than a halogen atom, a chain-like alkyl group which may have a substituent other than a halogen atom, or a chain-like alkenyl group which may have a substituent other than a halogen atom, and those that do not have a substituent and those having a substituent other than a halogen atom, among the cyclic group, the chain-like alkyl group, and the chain-like alkenyl group in the description for $R'^{201}$ above are exemplary examples.

Among these, it is preferable that $R^{b11}$ is an aromatic hydrocarbon group which may have a substituent other than a halogen atom, an aliphatic cyclic group which may have a substituent other than a halogen atom, or a chain-like alkyl group which may have a substituent other than a halogen atom. As the substituents which may be included in these groups, a hydroxyl group, an oxo group, an alkyl group, an aryl group, a lactone-containing cyclic group, an ether bond, an ester bond, and a combination thereof are exemplary examples.

In a case where an ether bond or an ester bond is included as the substituent, the substituent may be bonded through an alkylene group, and linking groups represented by General Formulae (y-al-1) to (y-al-7) are preferable as the substituent in this case.

In General Formulae (y-al-1) to (y-al-7), $V'^{101}$ in General Formulae (y-al-1) to (y-al-7) is bonded to $R^{b11}$ of Formula (I3-2).

(y-al-1)

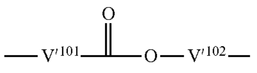

(y-al-2)

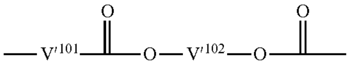

(y-al-3)

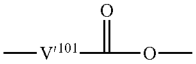

(y-al-4)

$$—V'^{101}—O—$$

(y-al-5)

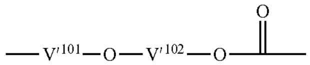

(y-al-6)

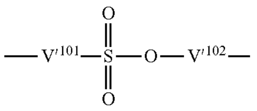

(y-al-7)

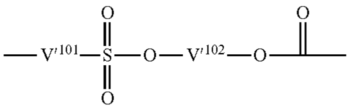

[in the formulae, $V'^{101}$ is a single bond or an alkylene group having 1 to 5 carbon atoms, and $V'^{102}$ is a divalent saturated hydrocarbon group having 1 to 30 carbon atoms]

As the divalent saturated hydrocarbon group in $V'^{102}$, an alkylene group having 1 to 30 carbon atoms is preferable, an alkylene group having 1 to 10 carbon atoms is more preferable, and an alkylene group having 1 to 5 carbon atoms is still more preferable.

The alkylene group in $V'^{101}$ and $V'^{102}$ may be a linear alkylene group or a branched alkylene group, and a linear alkylene group is preferable.

As the alkylene group in $V'^{101}$ and $V'^{102}$, specifically, a methylene group [$—CH_2—$]; an alkylmethylene group such as $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$, or $—C(CH_2CH_3)_2—$; an ethylene group [$—CH_2CH_2—$]; an alkylethylene group such as $—CH(CH_3)CH_2—$, $—CH(CH_3)CH(CH_3)—$, $—C(CH_3)_2CH_2—$, and $—CH(CH_2CH_3)CH_2—$; a trimethylene group (n-propylene group) [$—CH_2CH_2CH_2—$]; an alkyltrimethylene group such as $—CH(CH_3)CH_2CH_2—$ and $—CH_2CH(CH_3)CH_2—$; a tetramethylene group [$—CH_2CH_2CH_2CH_2—$]; an alkyltetramethylene group such as $—CH(CH_3)CH_2CH_2CH_2—$ and $—CH_2CH(CH_3)CH_2CH_2—$; and a pentamethylene group [$—CH_2CH_2CH_2CH_2CH_2$-] are exemplary examples.

In addition, a part of methylene groups in the alkylene group in $V'^{101}$ or $V'^{102}$ may be substituted with a divalent aliphatic cyclic group having 5 to 10 carbon atoms. As the aliphatic cyclic group, a divalent group formed by further removing one hydrogen atom from the cyclic aliphatic hydrocarbon group as $R'^{201}$ (a monocyclic alicyclic hydrocarbon group or a polycyclic alicyclic hydrocarbon group) is preferable; and a cyclohexylene group, a 1,5-adamantylene group, or a 2,6-adamantylene group is more preferable.

As the aromatic hydrocarbon group, a phenyl group or a naphthyl group is more preferable.

As the aliphatic cyclic group, a group formed by removing one or more hydrogen atoms from a polycycloalkane such as adamantane, norbornane, isobornane, tricyclodecane, and tetracyclododecane is more preferable.

The number of carbon atoms in the above-described chain-like alkyl group is preferably 1 to 10, and specifically, a linear alkyl group such as a methyl group, an ethyl group, a propyl group, a butyl group, a pentyl group, a hexyl group, a heptyl group, an octyl group, a nonyl group, and a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group are exemplary examples.

It is preferable that $R^{b11}$ is a cyclic group which may have a substituent other than a halogen atom.

Specific preferred examples of the anion moiety of the component (I3-2) are shown below.

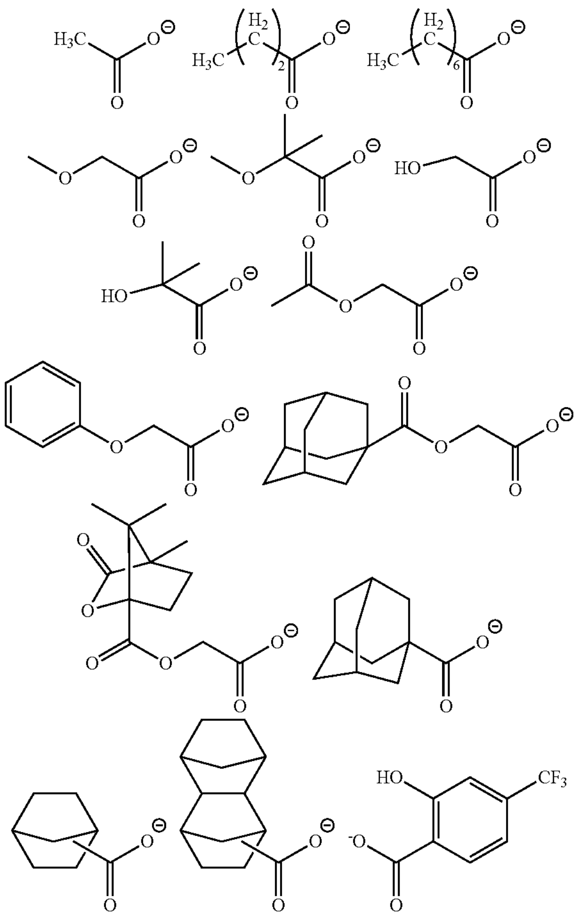

-continued

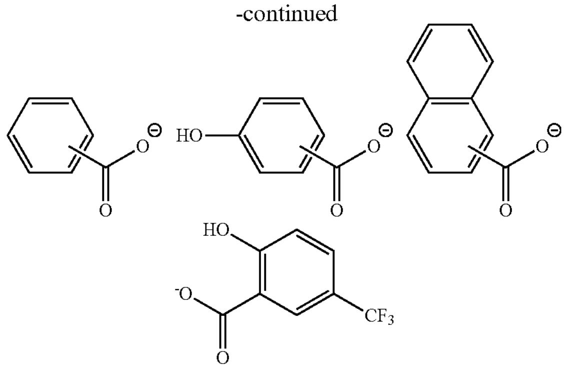

Cation Moiety

In Formula (I3-2), $M'^{m+}$ is an m-valent organic cation and has the same definition as that for $M'^{m+}$ in Formula (I3-1).

From the viewpoint of high elasticity of a resin film and ease of forming a fine structure without residues, it is preferable that the component (I) is a cationic polymerization initiator which generates an acid having a pKa (acid dissociation constant) of −5 or less upon exposure to light. It is possible to obtain high sensitivity upon exposure by using a cationic polymerization initiator that generates an acid having a pKa of more preferably −6 or less and still more preferably −8 or less. The lower limit value of the pKa of the acid generated from the component (I) is preferably −15 or more. The sensitivity is likely to be increased by using a cationic polymerization initiator which generates an acid having a pKa in the above-described suitable range.

Here, "pKa (acid dissociation constant)" is typically used as an index showing the acid strength of a target substance. The pKa in the present specification is a value obtained under a temperature condition of 25° C. In addition, the pKa value can be acquired by performing measurement according to a known technique. In addition, calculated values obtained by using a known software such as "ACD/Labs" (trade name, manufactured by Advanced Chemistry Development Inc.) can be used.

Specific examples of the suitable component (I3) are shown below.

(I3-1-1)

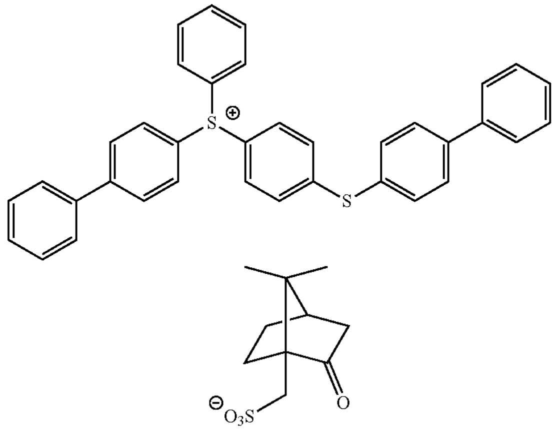

In the photosensitive composition according to the present embodiment, a component (I) including the component (I1) is used.

As such a component (I), a component (I) including only the component (I1) and a component (I) including the component (I1) and the component (I2) are suitable exemplary examples.

In the photosensitive composition according to the present embodiment, the total content of the component (I) is preferably 0.1 to 5 parts by mass, more preferably 0.2 to 4 parts by mass, and still more preferably 0.5 to 3 parts by mass with respect to 100 parts by mass of the total content of the above-described component (A) and the above-described component (B).

In a case where the content of the component (I) is more than or equal to the lower limit value of the above-described preferred range, sufficient sensitivity is obtained, and lithography characteristics of the pattern are further improved. In addition, the hardness of the cured film is further enhanced. On the other hand, in a case of being less than or equal to the upper limit value of the above-described preferred range, the sensitivity is appropriately controlled and a pattern having a favorable shape is easily obtained.

<Other Components>

The photosensitive composition according to the present embodiment may contain other components as necessary, in addition to the component (A), the component (B), the component (C), and the component (I) described above.

In the photosensitive composition according to the embodiment, as desired, it is possible to optionally add and contain miscible additives such as a metal oxide (M), a silane coupling agent, a sensitizer component, a solvent, an additive resin for improving film performance, a dissolution inhibitor, a basic compound, a plasticizer, a stabilizer, a colorant, and a halation-preventing agent.

<<Metal Oxide (M)>>

In addition to the component (A), the component (B), the component (C), and the component (I), the photosensitive composition according to the present embodiment may contain a metal oxide (M) (hereinafter, also referred to as "component (M)") since a cured film with increased hardness is easily obtained. In addition, by containing the component (M), a high-resolution pattern can be formed with a favorable shape.

As the component (M), oxides of metals such as silicon (metallic silicon), titanium, zirconium, and hafnium are exemplary examples. Among these, an oxide of silicon is preferable. In addition, it is particularly preferable to use silica.

In addition, it is preferable that the component (M) is particulate.

Such a particulate component (M) preferably includes a group consisting of particles having a volume average particle diameter of 5 to 40 nm, more preferably includes a group consisting of particles having a volume average particle diameter of 5 to nm, and still more preferably includes a group consisting of particles having a volume average particle diameter of 10 to 20 nm.

In a case where the volume average particle diameter of the component (M) is more than or equal to the lower limit value of the above-described preferred range, the hardness of the cured film is likely to be increased. On the other hand, in a case of being less than or equal to the upper limit value of the above-described preferred range, residues are unlikely to be generated during pattern formation, and a pattern with higher resolution is easily formed. In addition, transparency of the resin film is enhanced.

A particle diameter of the component (M) may be appropriately selected according to the exposure light source. Typically, it is considered that particles having a particle diameter of 1/10 or less with respect to the wavelength of light are almost not affected by light scattering. Therefore, for example, in a case where a fine structure is formed by photolithography with i-line (365 nm), it is preferable that a group (particularly preferably a group of silica particles) consisting of particles having a primary particle diameter (volume average value) of 10 to 20 nm is used as the component (M).

As a commercially available product of the component (M), for example, trade names "MEK-EC-2130Y" and "MEK-AC-2140-Z" manufactured by Nissan Chemical Industries, Ltd. are exemplary examples.

The component (M) may be used alone or in combination of two or more kinds thereof.

A content of the component (M) in a case of being contained is preferably 5 to 50 parts by mass, more preferably 10 to 40 parts by mass, and particularly preferably 20 to 30 parts by mass with respect to 100 parts by mass of the total content of the above-described component (A) and the above-described component (B).

In a case where the content of the component (M) is more than or equal to the lower limit value of the above-described preferred range, the hardness of the cured film is further increased. On the other hand, in a case of being less than or equal to the upper limit value of the above-described preferred range, the transparency of the resin film is further enhanced.

<<Silane Coupling Agent>>

The photosensitive composition according to the present embodiment may further contain an adhesive aid in order to improve adhesiveness to the substrate. As the adhesive aid, a silane coupling agent is preferable.

As the silane coupling agent, silane coupling agents having a reactive substituent such as a carboxy group, a methacryloyl group, an isocyanate group, and an epoxy group are exemplary examples. Specifically, trimethoxysilylbenzoic acid, γ-methacryloxypropyltrimethoxysilane, vinyltriacetoxysilane, vinyltrimethoxysilane, γ-glycidoxypropyltrimethoxysilane, and β-(3,4-epoxycyclohexyl)ethyltrimethoxysilane are exemplary examples.

The silane coupling agent may be used alone or in combination of two or more kinds thereof.

A content of the silane coupling agent in a case of being contained is preferably 0.1 to 10 parts by mass, more preferably 0.1 to 5 parts by mass, and still more preferably 0.1 to 3 parts by mass with respect to 100 parts by mass of the total content of the above-described component (A) and the above-described component (B).

In a case where the content of the silane coupling agent is within the above-described preferred range, the hardness of the cured film is further increased. In addition, the adhesiveness between the cured film and the substrate is further strengthened.

<<Sensitizer Component>>

The photosensitive composition according to the present embodiment may further contain a sensitizer component.

The sensitizer component is not particularly limited as long as it can absorb energy from exposure and transfer the energy to other substances.

As the sensitizer component, specifically, benzophenone-based photosensitizers such as benzophenone and p,p'-tetramethyldiaminobenzophenone, carbazole-based photosensitizers, acetophene-based photosensitizers, naphthalene-based photosensitizers such as 1,5-dihydroxynaphthalene, phenol-based photosensitizers, anthracene-based photosensitizers such as 9-ethoxyanthracene, and known photosensitizers such as biacetyl, eosin, rose bengal, pyrene, phenothiazine, and anthrone can be used.

The sensitizer component may be used alone or in combination of two or more kinds thereof.

A content of the sensitizer component in a case of being contained is preferably 0.1 to 15 parts by mass, more preferably 0.3 to 10 parts by mass, and still more preferably 0.5 to 5 parts by mass with respect to 100 parts by mass of the component (A).

In a case where the content of the sensitizer component is within the above-described preferred range, the sensitivity and the resolution are further enhanced.

<<Solvent>>

The photosensitive composition according to the present embodiment may further contain a solvent (hereinafter, may be referred to as "component (S)").

As the component (S), for example, lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols such as ethylene glycol, diethylene glycol, propylene glycol, and dipropylene glycol; compounds having an ester bond, such as 2-methoxybutyl acetate, 3-methoxybutyl acetate, 4-methoxybutyl acetate, ethylene glycol monoacetate, diethylene glycol monoacetate, propylene glycol monoacetate, or dipropylene glycol monoacetate; polyhydric alcohol derivatives such as compounds having an ether bond, for example, a monoalkylether such as monomethylether, monoethylether, monopropylether, or monobutylether or monophenylether of any of the polyhydric alcohols or the compounds having an ester bond [among these, propylene glycol monomethyl ether acetate (PGMEA), or propylene glycol monomethyl ether (PGME) is preferable]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene, and mesitylene; and dimethylsulfoxide (DMSO) are exemplary examples.

The component (S) may be used alone or in the form of a mixed solvent of two or more kinds thereof.

An amount of the component (S) used in a case of being contained is not particularly limited, and is appropriately set according to the thickness of the coating film at a concentration at which the photosensitive composition can be applied to a substrate or the like without dripping.

For example, the component (S) can be used so that the concentration of solid contents is 50% by mass or more, or the component (S) can be used so that the concentration of solid contents is 60% by mass or more.

In addition, an aspect in which the component (S) is not substantially contained (that is, an aspect in which the concentration of solid contents is 100% by mass) can be adopted.

The negative photosensitive composition according to the present embodiment described above contains the epoxy group-containing compound (A), the polyfunctional (meth) acrylate compound (B), the photoradical polymerization initiator (C), and the cationic polymerization initiator (I).

A conventionally known negative photosensitive composition for forming a top plate portion of a hollow structure, which consists of the epoxy group-containing compound (A) and the cationic polymerization initiator (I), has a problem that the film-like top plate portion is easily deformed by the heat treatment of PEB or the high-temperature heat treatment of the curing operation.

The negative photosensitive composition according to the present embodiment further contains the polyfunctional (meth)acrylate compound (B) and the photoradical polymerization initiator (C) with respect to the negative photosensitive composition containing the epoxy group-containing compound (A) and the cationic polymerization initiator (I). The epoxy group-containing compound (A) undergoes a crosslinking reaction with the cationic polymerization initiator (I), and the polyfunctional (meth)acrylate compound (B) undergoes a polymerization reaction with the photoradical polymerization initiator (C). Each reaction complicates a framework of the cured body forming the top plate portion, so that thermal deformability is improved, and doming due to deformation by heating during the curing can be suppressed.

The negative photosensitive composition according to this embodiment is useful as a material for forming a top plate portion of a hollow structure in electronic components.

As the hollow structure in electronic components, a hollow structure consisting of a recess portion and a top plate portion closing an opening surface of the recess portion, which will be mentioned in the description of (Method for producing hollow structure) later, is an exemplary example.

In addition, the negative photosensitive composition according to this embodiment further contains silica nanoparticles to improve elastic modulus. Therefore, the deformation by heating during the curing can be further suppressed.

(Photosensitive Resist Film)

The photosensitive resist film according to the present embodiment is obtained by laminating, on a base film, a photosensitive resin film formed of the photosensitive composition according to the embodiment described above and a cover film in this order.

For example, the photosensitive resist film according to the present embodiment can be produced by applying the photosensitive composition according to the embodiment described above onto the base film, drying the photosensitive composition to form a photosensitive resin film, and laminating the cover film on the photosensitive resin film.

The base film may be coated with the photosensitive composition according to an appropriate method using a blade coater, a lip coater, a comma coater, a film coater, or the like.

A thickness of the photosensitive resin film is preferably 100 μm or less and more preferably 5 to 50 μm.

A known film can be used as the base film, and for example, a thermoplastic resin film or the like is used. As the thermoplastic resin, polyesters such as polyethylene terephthalate are exemplary examples. A thickness of the base film is preferably 2 to 150 μm.

As the cover film, known films such as a polyethylene film and a polypropylene film can be used. As the cover film, a film in which adhesive force to the photosensitive resin film is smaller than that of the base film is preferable.

A thickness of the cover film is preferably 2 to 150 μm, more preferably 2 to 100 μm, and still more preferably 5 to 50 μm.

The base film and the cover film may be formed of the same film material, or may be formed of different film materials.

(Method for Producing Hollow Structure)

The method for producing a hollow structure according to the present embodiment is a method for producing a hollow structure consisting of a recess portion and a top plate portion closing an opening surface of the recess portion, in which the top plate portion is formed of the above-described negative photosensitive composition.

FIG. 1 is a schematic diagram representing the method for producing a hollow structure according to the present embodiment.

The method for producing a hollow structure illustrated includes a step (first step (S1)) of forming sidewalls on a substrate, and a step (second step (S2)) of forming a top plate portion on the sidewalls to produce the hollow structure. Hereinafter, details of the first step (S1) and the second step (S2) will be described.

[First Step (S1)]

In the first step, sidewalls 20 are formed on a substrate 10 to obtain the substrate having a recess portion 15 on a surface.

In [FIRST STEP] of FIG. 1, the substrate 10 having the recess portion 15 on the surface by the substrate 10 and the sidewalls 20 formed on the substrate 10 is illustrated.

<<Regarding Substrate Having Recess Portion on Surface>>

As the substrate 10 having the recess portion 15 on the surface, a structure in which a pattern is formed on the substrate 10 and a stepped substrate are exemplary examples. The recess portion 15 may be formed of an organic material or an inorganic material.

Such a substrate 10 having the recess portion 15 on the surface can be produced, for example, by a method including a step (hereinafter, referred to as "film formation step") of forming a photosensitive resin film on a support using a negative photosensitive composition, a step (hereinafter, referred to as "exposure step") of exposing the photosensitive resin film to light, and a step (hereinafter, referred to as "development step") of developing the exposed photosensitive resin film with a developing solution containing an organic solvent to form a negative pattern which is to be the sidewall 20 of the recess portion 15. The method for producing the substrate 10 having the recess portion 15 on the surface can be performed as follows.

Film Formation Step:

First, a photosensitive resin film is formed by coating a support with the negative photosensitive composition using known methods such as a spin coating method, a roll coating method, and a screen printing method, and by performing a bake (post apply bake (PAB)) treatment under a temperature condition of, for example, 50° C. to 150° C. for 2 to 60 minutes.

The film formation step can also be performed by disposing, on the support, a photosensitive composition layer which is prepared in advance using the negative photosensitive composition.

The support is not particularly limited and a known support in the related art can be used. For example, substrates for electronic components and substrates on which a predetermined wiring pattern is formed are exemplary examples.

As the substrates for electronic components, more specifically, substrates of metals such as silicon, silicon nitride, titanium, tantalum, lithium tantalate ($LiTaO_3$), niobium, lithium niobate ($LiNbO_3$), palladium, titanium tungsten, copper, chromium, iron, and aluminum, and glass substrates are exemplary examples.

As the materials for the wiring pattern, for example, copper, aluminum, nickel, and gold can be used.

A film thickness of the photosensitive resin film to be formed of the negative photosensitive composition is not particularly limited, but is preferably approximately 10 to 100 μm.

Exposure Step:

Next, the formed photosensitive resin film is exposed through a mask having a predetermined pattern (mask pattern) formed thereon using a known exposure device or selectively exposed through drawing or the like by performing direct irradiation with electron beams without using a mask pattern therebetween. In addition, a bake (post exposure bake (PEB)) treatment is performed as necessary under a temperature condition of, for example, 80° C. to 150° C. for 40 to 1200 seconds, preferably 40 to 1000 seconds and more preferably 60 to 900 seconds.

The wavelength used in the exposure is not particularly limited, and the exposure is performed by selectively irradiating (exposing) with radiation, for example, ultraviolet rays having a wavelength of 300 to 500 nm, i-line (wavelength of 365 nm), or visible light rays. As these radiation sources, a low pressure mercury lamp, a high pressure mercury lamp, an ultra-high pressure mercury lamp, a metal halide lamp, and an argon gas laser can be used.

Here, the radiation indicates ultraviolet rays, visible light rays, far ultraviolet rays, X-rays, electron beams, or the like. The irradiation amount varies depending on the type of each component in the composition, the blending amount thereof, the film thickness of the coating film, and the like. For example, in a case where an ultra-high pressure mercury lamp is used, the irradiation amount thereof is 100 to 2000 mJ/cm 2.

The photosensitive resin film may be exposed through typical exposure (dry exposure) performed in air or an inert gas such as nitrogen or through liquid immersion exposure (liquid immersion lithography).

Development Step:

Next, the above-described exposed photosensitive resin film is developed with a developing solution (organic developing solution) containing an organic solvent. After the development, it is preferable that a rinse treatment is performed. As necessary, a bake treatment (post bake) may be performed.

The organic solvent contained in the organic developing solution can be appropriately selected from known organic solvents. Specifically, polar solvents such as ketone solvents, ester solvents, alcohol solvents, nitrile solvents, amide solvents, and ether solvents; and hydrocarbon solvents are exemplary examples.

As the ketone solvent, 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylenecarbonate, γ-butyrolactone, and methyl amyl ketone (2-heptanone) are exemplary examples. Among these, as the ketone solvent, methyl amyl ketone (2-heptanone) is preferable.

As the ester solvent, methyl acetate, butyl acetate, ethyl acetate, isopropyl acetate, amyl acetate, isoamyl acetate, ethyl methoxyacetate, ethyl ethoxyacetate, propylene glycol monomethyl ether acetate (PGMEA), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate are exemplary examples. Among these, as the ester solvent, butyl acetate or PGMEA is preferable.

As the nitrile solvent, acetonitrile, propionitrile, valeronitrile, and butyronitrile are exemplary examples.

Known additives can be blended with the organic developing solution as necessary. As the additive, for example, a surfactant is an exemplary example. The surfactant is not particularly limited, and for example, an ionic or non-ionic fluorine-based and/or silicon-based surfactant can be used.

As the surfactant, a non-ionic surfactant is preferable, and a non-ionic fluorine-based surfactant or a non-ionic silicon-based surfactant is more preferable.

In a case where a surfactant is blended, the blending amount thereof is typically 0.001% to 5% by mass, preferably 0.005% to 2% by mass, and more preferably 0.01% to 0.5% by mass with respect to the total amount of the organic developing solution.

The development treatment can be performed by a known developing method. For example, a method of immersing a support in a developing solution for a predetermined time (a dip method), a method of stacking up a developing solution on the surface of a support using the surface tension and maintaining the state for a predetermined time (a puddle method), a method of spraying a developing solution to the surface of a support (a spray method), and a method of continuously ejecting a developing solution from a developing solution ejecting nozzle onto a support rotating at a constant speed while scanning the developing solution ejecting nozzle at a constant speed (a dynamic dispense method) are exemplary examples.

The rinse treatment (washing treatment) using a rinse liquid can be performed according to a known rinse method. As the rinse treatment method, for example, a method of continuously ejecting a rinse liquid onto a support rotating at a constant speed (a rotary coating method), a method of immersing a support in a rinse liquid for a predetermined time (a dip method), and a method of spraying a rinse liquid to the surface of a support (a spray method) are exemplary examples.

In the rinse treatment, it is preferable to use a rinse liquid containing an organic solvent.

By the above-described film formation step, exposure step, and development step, the substrate 10 having the recess portion 15 on the surface (structure in which a pattern is formed on the substrate or stepped substrate) can be produced.

A thickness (horizontal dimension with respect to the support) and a height (vertical dimension with respect to the support) of the sidewall 20 can be appropriately set based on a size of a hollow portion, which is determined according to the type of electronic device accommodated in the recess portion 15.

[Second Step (S2)]

In the second step according to the present embodiment, an exposed portion 30A serving as the top plate portion is formed on the sidewalls 20 formed in the first step to produce the hollow structure.

The second step according to the present embodiment includes the following steps (i), (ii), (iii), (iv), and (v).

Step (i): step of disposing a photosensitive resist film 30F such that the photosensitive resist film 30F closes an opening surface of the recess portion 15 formed by the sidewalls 20 and the substrate 10, and peeling off a base film from a photosensitive resin film 30 constituting the photosensitive resist film 30F Step (ii): step of exposing the photosensitive resin film 30 after the step (i) to light Step (iii): step of heat-treating the photosensitive resin film 30 after the step (ii)

Step (iv): step of developing the photosensitive resin film 30 after the step (iii) to form, in the substrate 10 having the recess portion 15 on the surface, which is prepared in the first step (S1), a negative pattern (exposed portion 30A) closing the opening surface of the recess portion 15 formed by the sidewalls 20 and the substrate 10

Step (v): step of further heat-treating the negative pattern (exposed portion 30A) after the step (iv) to be cured, thereby obtaining a hollow structure 100 in which the exposed portion 30A serving as the top plate portion is composed of a cured body 40 of the photosensitive resin film The hollow structure produced by the producing method according to this aspect consists of the recess portion 15 and the top plate portion closing the opening surface of the recess portion 15. The hollow structure can be suitably used for hollow packages used in SAW filters, MEMS, various sensors, and the like.

<<Regarding Photosensitive Resist Film>>

The photosensitive resist film 30F according to the present embodiment has, for example, the negative photosensitive resin film 30 formed of the negative photosensitive composition described above.

In a case where the photosensitive resin film 30 is formed using such a photosensitive resist film 30F and selective exposure is performed on the photosensitive resin film 30, since the component (I) generates an acid in the exposed portion 30A of the photosensitive resin film 30, and an epoxy group in the component (A) is subjected to ring-opening polymerization due to an action of the acid so that solubility of the component (A) in a developing solution containing an organic solvent is decreased while the solubility of the component (A) in the developing solution containing an organic solvent is not changed in an unexposed portion 30B of the photosensitive resin film 30. Therefore, a difference in solubility in the developing solution containing an organic solvent occurs between the exposed portion 30A of the photosensitive resin film 30 and the unexposed portion 30B of the photosensitive resin film 30. That is, the photosensitive resin film 30 is negative type.

Accordingly, in a case where the photosensitive resin film 30 is developed with the developing solution containing an organic solvent, the unexposed portion 30B is dissolved and removed so that a negative pattern is formed.

Here, the negative photosensitive resin film 30 of the photosensitive resist film 30F is typically composed of a B-stage (semi-cured) resin material.

As the photosensitive resist film 30F, a laminated film in which the photosensitive resin film 30 is laminated on a base film is an exemplary example. As the photosensitive resist film 30F according to the present embodiment, it is preferable to use a laminated film in which the photosensitive resin film 30 is laminated on a base film.

Such a photosensitive resist film 30F can be produced by coating a base film with the above-described negative photosensitive composition, and drying the composition to form the photosensitive resin film 30.

The base film may be coated with the negative photosensitive composition according to an appropriate method using an applicator, a blade coater, a lip coater, a comma coater, a film coater, or the like.

A thickness of the photosensitive resin film 30 is preferably 100 lam or less and more preferably 5 to 50 μm.

A known film can be used as the base film, and for example, a thermoplastic resin film or the like is used. As the thermoplastic resin, polyesters such as polyethylene terephthalate are exemplary examples. A thickness of the base film is preferably 2 to 150 μm.

[[Step (i)]]

In the step (i), the photosensitive resist film 30F is disposed such that a surface of the photosensitive resin film 30 constituting the photosensitive resist film 30F closes the opening surface of the recess portion 15. Thereafter, the base film is peeled off from the photosensitive resin film 30 constituting the photosensitive resist film 30F.

In FIG. 1, the photosensitive resin film 30 constituting the photosensitive resist film 30F is disposed so as to face the substrate 10 with the sidewalls 20 interposed therebetween. A hollow closed space (cavity) surrounded by the substrate 10, the sidewalls 20, and the photosensitive resin film 30 is formed.

[[Step (ii)]]

In the step (ii), the photosensitive resin film 30 is exposed to light.

For example, using a known exposure device, the photosensitive resin film 30 is selectively exposed through a photomask 60 on which a predetermined pattern is formed.

The wavelength used in the exposure is not particularly limited, and the exposure is performed by selectively irradiating (exposing) with radiation, for example, ultraviolet rays having a wavelength of 300 to 500 nm, i-line (wavelength of 365 nm), or visible light rays. As these radiation sources, a low pressure mercury lamp, a high pressure mercury lamp, an ultra-high pressure mercury lamp, a metal halide lamp, and an argon gas laser can be used.

[[Step (iii)]]

In the step (iii), the exposed photosensitive resin film 30 is subjected to a heat treatment, a so-called post exposure bake (PEB) treatment.

The PEB treatment is performed, for example, at a temperature of 80° C. to 150° C. for 40 to 600 seconds, preferably 60 to 300 seconds. By the heat treatment in the step (iii), the exposed photosensitive resin film 30 has the exposed portion 30A in which the epoxy group in the component (A) is subjected to ring-opening polymerization, and the unexposed portion 30B which remains unchanged.

[[Step (iv)]]

In the step (iv), the photosensitive resin film 30 (exposed portion 30A and unexposed portion 30B) after the PEB treatment is developed to form a negative pattern (exposed portion 30A).

The development here can be performed in the same manner as in [Development step] described above. After the development, it is preferable that a rinse treatment is performed.

The development in the step (iv) dissolves and removes the unexposed portion 30B, leaving an afterimage of the exposed portion 30A as the negative pattern. The exposed portion 30A serves as the top plate portion (roof closing the opening surface of the recess portion).

[[Step (v)]]

In the step (v), the developed negative pattern (exposed portion 30A) is cured by further performing a heat treatment (curing operation) so that a hollow structure 100 in which the exposed portion 30A (top plate portion) is composed of a cured body 40 of the photosensitive resin film 30 is obtained.

In FIG. 1, the cured body 40 is formed by curing and integrating the photosensitive resin material forming the sidewalls 20 and the photosensitive resin film 30.

In the method for producing a hollow structure according to the embodiment, since the above-described negative photosensitive composition is used, deformation and swelling (doming) of the top plate portion due to the curing operation are suppressed. As a result, it is possible to stably reduce the height of electronic components.

EXAMPLES

Hereinafter, the present invention will be described in more detail with reference to examples, but the present invention is not limited to the following examples.

<Preparation of Negative Photosensitive Composition>

Examples 1 to 5 and Comparative Examples 1 to 3

Respective components listed in Table 1 were mixed and dissolved in methyl ethyl ketone (MEK), and the solution was filtered using a PTFE filter (a pore diameter of 1 μm, manufactured by Pall Corporation) to prepare each negative photosensitive composition (a solution having a concentration of solid contents of 70% to 75% by mass) of each example.

TABLE 1

| | | | Component (I) | | | |
|---|---|---|---|---|---|---|
| | Component (A) | Component (B) | Component (I1) | Component (I2) | Component (C) | Component (M) |
| Example 1 | (A1)-1 [90] | (B)-1 [10] | (I1)-1 [1.7] | (I2)-1 [0.56] | (C)-1 [2.5] | (M)-1 [25] |
| Example 2 | (A1)-1 [90] | (B)-1 [10] | (I1)-2 [1] | — | (C)-1 [2.5] | (M)-1 [25] |

TABLE 1-continued

| | Component (I) | | | | | |
|---|---|---|---|---|---|---|
| | Component (A) | Component (B) | Component (I1) | Component (I2) | Component (C) | Component (M) |
| Example 3 | (A1)-2 [90] | (B)-1 [10] | (I1)-2 [2] | — | (C)-1 [2.5] | (M)-1 [25] |
| Example 4 | (A1)-3 [90] | (B)-1 [10] | (I1)-2 [2] | — | (C)-1 [2.5] | (M)-1 [25] |
| Example 5 | (A1)-1 [90] | (B)-1 [10] | (I1)-2 [1] | — | (C)-2 [0.1] | (M)-1 [25] |
| Comparative Example 1 | (A1)-1 [100] | — | (I1)-2 [1] | — | — | (M)-1 [25] |
| Comparative Example 2 | (A1)-1 [90] | (B)-1 [10] | (I1)-2 [1] | — | — | (M)-1 [25] |
| Comparative Example 3 | (A1)-1 [90] | (B)-1 [10] | — | — | (C)-1 [2.5] | (M)-1 [25] |

In Table 1, each abbreviation has the following meaning. The numerical values in [ ] are the blending amounts (parts by mass, in terms of solid content) of the respective components.

(A1)-1: epoxy resin represented by Chemical Formula (A1-1), trade name "jER-157S70" manufactured by Mitsubishi Chemical Corporation (A1)-2: epoxy resin represented by Chemical Formula (A1-2), trade name "TECHMORE VG-3101L" manufactured by PRINTEC, INC.

(A1)-3: epoxy resin represented by Chemical Formula (A1-3), trade name "YDCN-704" manufactured by NIPPON STEEL Chemical & Material Co., Ltd.

(A1-1)

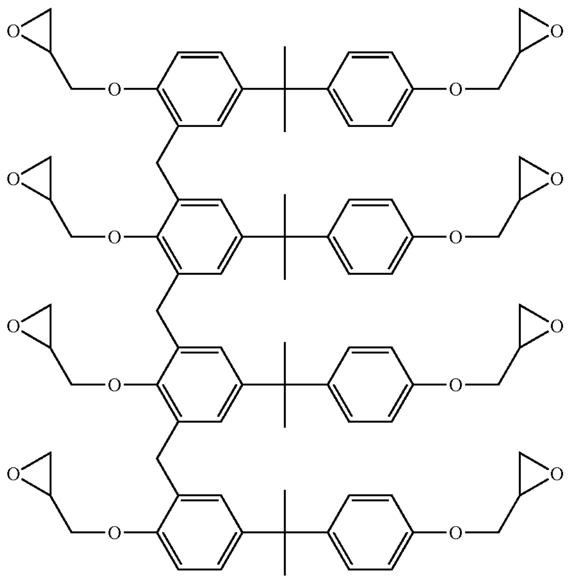

-continued (A1-2)

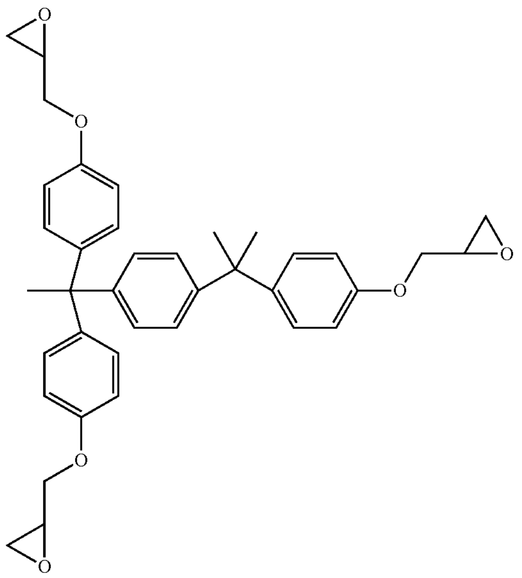

(A1-3)

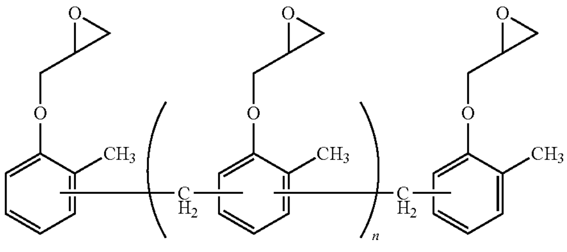

(B)-1: polyfunctional acrylate compound represented by Chemical Formula (B-1), trade name "KAYARAD DPHA" manufactured by Nippon Kayaku Co., Ltd.

(B-1)

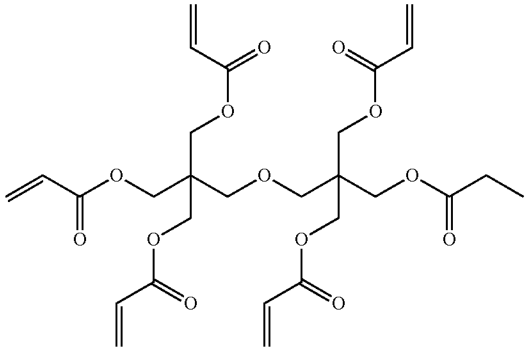

(I1)-1: cationic polymerization initiator represented by Chemical Formula (I1-1)

(I1)-2: cationic polymerization initiator represented by Chemical Formula (I1-2)

(I1-1)

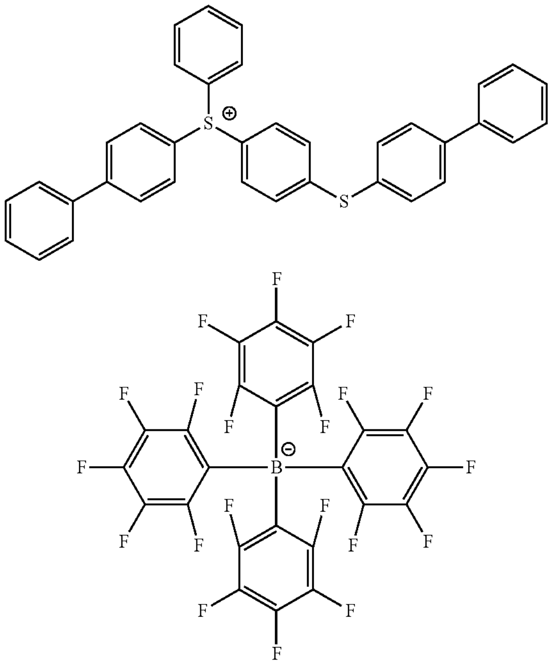

(I1-2)

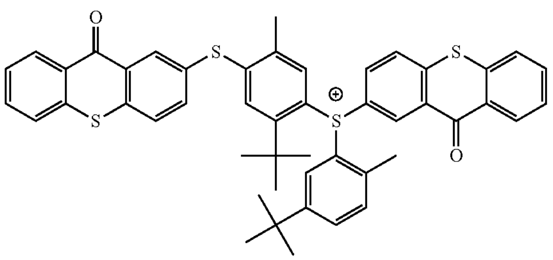

-continued

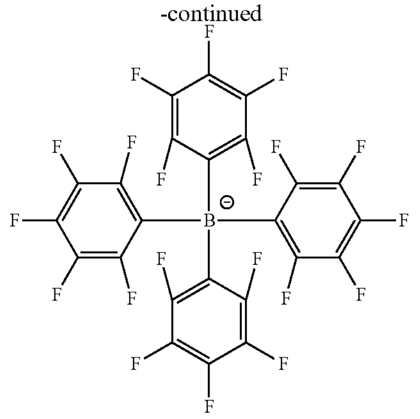

(I2)-1: cationic polymerization initiator represented by Chemical Formula (I2-1-2)

(I2-1-2)

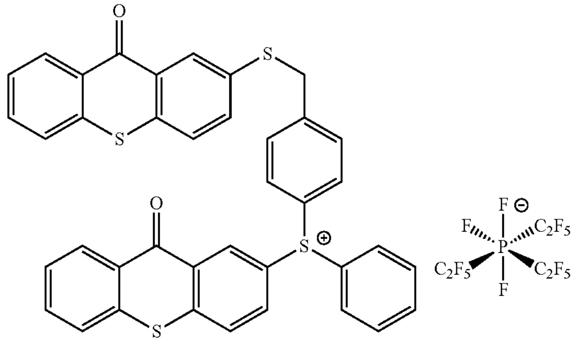

(C)-1: photoradical polymerization initiator represented by Chemical Formula (C-1), trade name "Omnirad 651" manufactured by IGM Resins B. V.

(C)-2: photoradical polymerization initiator represented by Chemical Formula (C-2), trade name "Omnirad 819" manufactured by IGM Resins B. V.

(C-1)

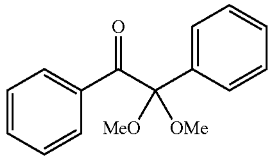

(C-2)

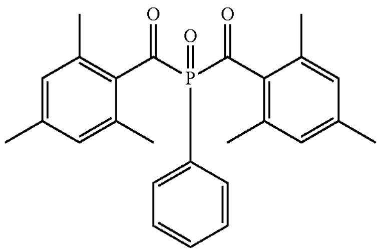

(M)-1: nanosilica particles (particle diameter: 15 nm), trade name "MEK-EC-2130Y" manufactured by Nissan Chemical Industries, Ltd.

<Production of Hollow Structure>

Using the negative photosensitive compositions of Examples 1 to 5 and Comparative Examples 1 to 3, hollow structures of each example were obtained. The hollow structure was obtained by the following first step (S1) and second step (S2).

[First Step (S1)]

A substrate having a recess portion on a surface was obtained by forming sidewalls on a silicon substrate through the following film formation step, exposure step, and development step.

Film Formation Step:

TMMFS2000 (manufactured by TOKYO OHKA KOGYO CO., LTD., dry film resist having a film thickness of 20 μm) was laminated on a silicon wafer under the conditions of 80° C., 0.3 MPa, and 0.5 m/min such that a film thickness was 20 μm.

Exposure Step:

A base film in contact with the photosensitive resin film having a film thickness of 20 μm was peeled off, and using a Canon PLA-501 ghi line aligner, the photosensitive resin film was irradiated with ghi rays at an irradiation amount of 200 mJ/cm 2 through a mask having an opening pattern of 500 μm×500 μm. Thereafter, the exposed photosensitive resin film was subjected to a heat treatment on a hot plate at 90° C. for 5 minutes.

Development Step:

The heat-treated photosensitive resin film was puddle-developed at 23° C. using propylene glycol monomethyl ether acetate as a developing solution to form a negative pattern for sidewalls.

The negative pattern was further cured by a heat treatment in an oven (under nitrogen, 200° C., 1 hour) to form a substrate having a recess portion on a surface, which was composed of a cured body of the photosensitive resin film.

[Second Step (S2)]

With the substrate having the recess portion on the surface, obtained in the first step, a hollow structure was produced by forming a top plate portion closing an opening surface of the recess portion by the following steps (i) to (v).

- Step (i): step of disposing a photosensitive resist film such that the photosensitive resist film closed the opening surface of the recess portion of the substrate, and peeling off the base film from the photosensitive resin film constituting the photosensitive resist film
- Step (ii): step of exposing the photosensitive resin film after the step (i) to light
- Step (iii): step of heat-treating the photosensitive resin film after the step (ii)
- Step (iv): step of developing the photosensitive resin film after the step (iii) to form, in the substrate having the recess portion on the surface, which was prepared in the first step (S1), a negative pattern (exposed portion) closing the opening surface of the recess portion formed by the sidewalls and the substrate
- Step (v): step of further heat-treating the negative pattern (exposed portion) after the step (iv) to be cured, thereby obtaining a hollow structure in which the exposed portion serving as the top plate portion was composed of a cured body of the photosensitive resin film

[[Step (i)]]

First, the substrate having the recess portion on the surface, which had been obtained in the first step, was prepared.

The negative photosensitive composition of each example was applied onto the base film using an applicator, and subjected to a bake treatment (PAB) in an oven at 70° C. for 10 minutes to form a photosensitive resin film having a film thickness of 20 to 30 μm and obtain a photosensitive resist film.

The photosensitive resist film was disposed such that a surface of the photosensitive resin film in the photosensitive resist film closed the opening surface of the sidewalls in the substrate having the sidewalls.

Thereafter, an operation was performed to peel off the base film from the photosensitive resin film in the photosensitive resist film. By the operation, a hollow closed space (cavity) surrounded by the substrate, the sidewalls, and the photosensitive resin film was formed.

[[Step (ii)]]

Next, using a Canon PLA-501 ghi line aligner, the photosensitive resin film was irradiated with ghi rays at an irradiation amount of 300 $mJ/cm^2$.

[[Step (iii)]]

The exposed photosensitive resin film in the step (ii) was subjected to a heat treatment (PEB treatment) on a hot plate at 90° C. for 5 minutes.

By the PEB treatment in the step (iii), the exposed photosensitive resin film had the exposed portion (top plate portion) in which the epoxy group in the component (A) was subjected to ring-opening polymerization, and the unexposed portion which remained unchanged.

[[Step (iv)]]

The heat-treated photosensitive resin film in the step (iii) was puddle-developed at 23° C. using propylene glycol monomethyl ether acetate as a developing solution to form a negative pattern for the top plate portion.

The development in the step (iv) dissolved and removed the unexposed portion, leaving an afterimage of the exposed portion (top plate portion) as the negative pattern.

[[Step (v)]]

The negative pattern after the step (iv) was further cured by performing a heat treatment (curing operation) in an oven, thereby obtaining a hollow structure including a cured body of the photosensitive resin film, in which the top plate portion was formed of the negative photosensitive composition of each example.

<Evaluation of Doming>

With regard to the obtained hollow structure of each example, swelling (doming) of the top plate portion after the high-temperature heat treatment of the curing operation was measured using a stylus profiling system (Dektak XT, manufactured by Bruker).

In a case of evaluating the doming, a height ($H_0$) from the substrate before the heat treatment of PEB (after the step (ii) and before the step (iii)) to an upper surface of the top plate portion was measured in advance.

In Table 2, "After Cure" is a value ($H_1-H_0$) obtained by subtracting the height ($H_0$) from the substrate before the heat treatment of PEB to the upper surface of the top plate portion, from a height ($H_1$) from the substrate after the high-temperature heat treatment of the curing operation (after the step (v)) to an upper surface of the cured body. The value ($H_1-H_0$) is shown in Table 2 as a measurement result.

TABLE 2

| | After Cure |
|---|---|
| Example 1 | 7.9 μm |
| Example 2 | 6.4 μm |
| Example 3 | 5.6 μm |
| Example 4 | 7.7 μm |
| Example 5 | 7.9 μm |

TABLE 2-continued

| | After Cure |
|---|---|
| Comparative Example 1 | 10.7 μm |
| Comparative Example 2 | 12.4 μm |
| Comparative Example 3 | — |

From the results shown in Table 2, it was confirmed that, in the top plate portion of the hollow structure, formed of the negative photosensitive compositions of Examples 1 to 5 to which the present invention was applied, the doming of the heat treatment during production of the hollow structure, such as the heat treatment of PEB and the high-temperature heat treatment of the curing operation, was suppressed.

In a case where the negative photosensitive composition of Comparative Example 3 was used, the top plate portion could not be formed, and no data was obtained.

Although preferred examples of the present invention are described above, the present invention is not limited to these examples. It is possible to add other configurations or to omit, replace, or modify the configurations described herein without departing from the spirit of the present invention. The present invention is not limited by the above description, but only by the scope of the appended claims.

REFERENCE SIGNS LIST

10: Substrate

15: Recess portion

20: Sidewall

30: Photosensitive resin film

30A: Exposed portion (top plate portion)

30B: Unexposed portion

30F: Photosensitive resist film

40: Cured body

60: Photomask

What is claimed is:

1. A negative photosensitive composition for forming a top plate portion of a hollow structure, the negative photosensitive composition comprising:

an epoxy group-containing compound;

a cationic polymerization initiator;

a polyfunctional (meth)acrylate compound; and a photoradical polymerization initiator, wherein the epoxy group-containing compound is selected from the group consisting of an epoxy resin represented by General Formula (anv0), a resin having a constitutional unit represented by General Formula (anv1) and a compound represented by Chemical Formula (A3-1), wherein a content of the epoxy group-containing compound is 50 parts by mass or more with respect to 100 parts by mass of a total content of the epoxy group-containing compound and the polyfunctional (meth) acrylate compound, (anv0)

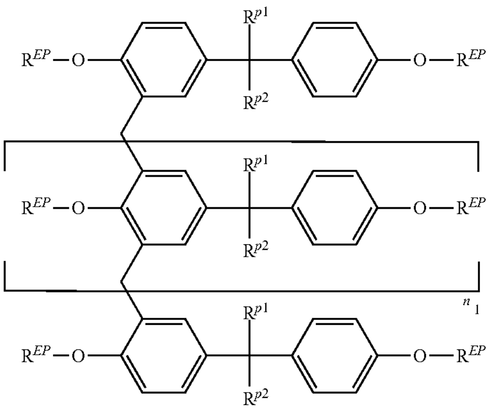

wherein $R^{p1}$ and $R^{p2}$ are each independently a hydrogen atom or an alkyl group having 1 to 5 carbon atoms, a plurality of $R^{p1}$'s may be the same or different from each other, a plurality of $R^{p2}$'s may be the same or different from each other, $n_1$ is an integer of 1 to 5, $R^{EP}$ is an epoxy group-containing group, and a plurality of $R^{EP}$'s may be the same or different from each other (anv1)

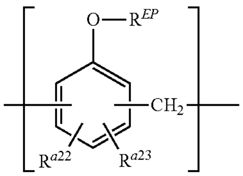

wherein $R^{EP}$ is an epoxy group-containing group, and $R^{a22}$ and $R^{a23}$ are each independently a hydrogen atom, an alkyl group having 1 to 5 carbon atoms, or a halogen atom, (A3-1)

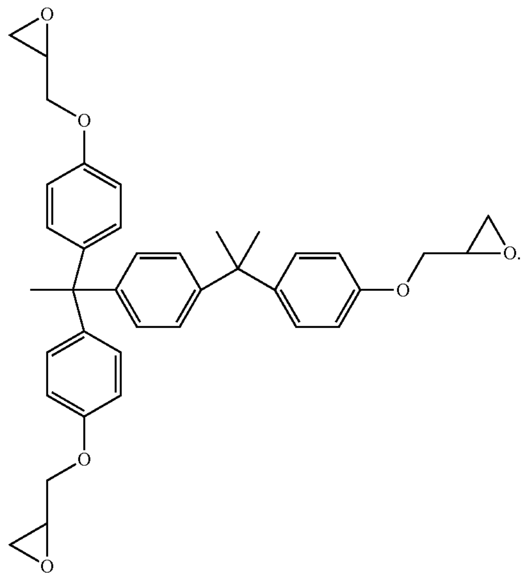
.

2. The negative photosensitive composition according to claim 1, further comprising silica nanoparticles.

3. The negative photosensitive composition according to claim 1, wherein a content of the cationic polymerization initiator is 0.01 to 50 parts by mass with respect to 100 parts by mass of a content of the polyfunctional (meth)acrylate compound.

4. A method for producing a hollow structure consisting of a recess portion and a top plate portion closing an opening surface of the recess portion, the method comprising forming the top plate portion using the negative photosensitive composition according to claim 1.

* * * * *